US006313565B1

(12) United States Patent
Puskas

(10) Patent No.: US 6,313,565 B1
(45) Date of Patent: Nov. 6, 2001

(54) MULTIPLE FREQUENCY CLEANING SYSTEM

(76) Inventor: William L. Puskas, Eaton Grange Rd., Sutton, NH (US) 03257-1676

(*) Notice: Subject to any disclaimer, the term of this patent is extended or adjusted under 35 U.S.C. 154(b) by 0 days.

(21) Appl. No.: 09/504,567

(22) Filed: Feb. 15, 2000

(51) Int. Cl.[7] ..................... H01L 41/08
(52) U.S. Cl. ..................... 310/316.01; 310/317
(58) Field of Search ..................... 310/316.01, 317, 310/318, 319, 334, 336, 337

(56) References Cited

U.S. PATENT DOCUMENTS

| | | | |
|---|---|---|---|
| Re. 25,433 | 8/1963 | Rich . | |
| 2,585,103 | 2/1952 | Fitzgerald | 99/250 |
| 2,891,176 | 6/1959 | Branson | 310/8.1 |
| 2,985,003 | 5/1961 | Gelfand | 68/3 |
| 3,066,232 | 11/1962 | Branson | 310/8.7 |
| 3,094,314 | 6/1963 | Kearney et al. | 259/72 |
| 3,113,761 | 12/1963 | Platzman | 259/72 |
| 3,152,295 | 10/1964 | Schebler | 318/118 |
| 3,187,207 | 6/1965 | Tomes | 310/8.7 |
| 3,218,488 | 11/1965 | Jacke | 310/325 |
| 3,230,403 | 1/1966 | Lewis et al. | 310/8.7 |
| 3,293,456 | 12/1966 | Shoh | 310/8.1 |
| 3,315,102 | 4/1967 | Quint et al. | 310/8.1 |
| 3,318,578 | 5/1967 | Branson | 259/1 |
| 3,371,233 | 2/1968 | Cook | 310/8.1 |
| 3,433,462 | 3/1969 | Cook | 259/1 |
| 3,629,726 | 12/1971 | Popescu | 331/116 M |
| 3,638,087 | 1/1972 | Ratcliff | 318/118 |
| 3,648,188 | 3/1972 | Ratcliff | 330/26 |
| 3,651,352 | 3/1972 | Puskas | 310/8.1 |
| 3,690,333 | 9/1972 | Kierner | 134/95 |
| 3,727,112 | 4/1973 | Popescu | 317/146 |
| 3,735,159 | 5/1973 | Murry | 310/8.3 |
| 3,746,897 | 7/1973 | Karatjas | 310/8.1 |
| 3,778,758 | 12/1973 | Carson | 310/10 |
| 3,804,329 | 4/1974 | Martner | 239/4 |
| 3,842,340 | 10/1974 | Brandquist | 321/45 R |
| 3,893,869 | 7/1975 | Mayer et al. | 134/86 |
| 3,975,650 | 8/1976 | Payne | 310/8.1 |
| 4,044,297 | 8/1977 | Nobue et al. | 323/4 |
| 4,054,848 | 10/1977 | Akita | 331/116 R |
| 4,069,444 | 1/1978 | Heim | 318/114 |
| 4,081,706 | 3/1978 | Edelson | 310/316 |
| 4,109,174 | 8/1978 | Hodgson | 310/316 |

(List continued on next page.)

FOREIGN PATENT DOCUMENTS

| | | |
|---|---|---|
| 2120654 | 11/1971 | (DE) . |
| 29 50 893 | 12/1979 | (DE) . |
| 0 123 277 | 10/1984 | (EP) . |
| 1 256 188 | 12/1971 | (GB) . |
| 1 323 196 | 7/1973 | (GB) . |
| 1 331 100 | 9/1973 | (GB) . |
| 1 488 252 | 10/1977 | (GB) . |
| 2 060 220 | 4/1981 | (GB) . |
| 2 097 890 | 11/1982 | (GB) . |
| 2 161 037 | 1/1986 | (GB) . |
| 2 170 663 | 8/1986 | (GB) . |
| 0 050 898 | 3/1983 | (JP) . |
| 0 076 399 | 4/1987 | (JP) . |
| 97/42790 | 11/1997 | (WO) . |

*Primary Examiner*—Mark O. Budd
(74) *Attorney, Agent, or Firm*—McDermott, Will & Emery

(57) ABSTRACT

The invention utilizes multiple frequency sound in liquids to improve the cleaning or processing effect. The sound frequencies are produced in two or more non-overlapping continuous frequency ranges. The sound frequencies are controlled to change frequency within the frequency ranges and the sound frequencies are programmed by a digital code to jump amongst the frequency ranges. The sound frequencies may change continuously within the frequency ranges, and the sound frequencies may jump discontinuously from one frequency range to another. The frequency ranges may also be within different, non-contiguous and non-overlapping frequency bands.

102 Claims, 15 Drawing Sheets

U.S. PATENT DOCUMENTS

| | | | |
|---|---|---|---|
| 4,118,649 | 10/1978 | Shwartzman et al. | 310/337 |
| 4,120,699 | 10/1978 | Kennedy, Jr. et al. | 134/1 |
| 4,141,608 | 2/1979 | Breining et al. | 310/316 |
| 4,156,157 | 5/1979 | Mabille | 310/316 |
| 4,175,242 | 11/1979 | Kleinschmidt | 310/316 |
| 4,275,363 | 6/1981 | Mishiro et al. | 331/4 |
| 4,326,553 | 4/1982 | Hall | 134/153 |
| 4,391,672 | 7/1983 | Lehtinen | 162/192 |
| 4,398,925 | 8/1983 | Trinh et al. | 55/15 |
| 4,409,999 | 10/1983 | Pedziwiatr | 134/95 |
| 4,418,297 | 11/1983 | Marshall | 310/316 |
| 4,431,975 | 2/1984 | Podlesny | 331/117 R |
| 4,527,901 | 7/1985 | Cook | 366/127 |
| 4,543,130 | 9/1985 | Shwartzman | 134/1 |
| 4,554,477 | 11/1985 | Ratcliff | 310/316 |
| 4,559,826 | 12/1985 | Nelson | 73/632 |
| 4,633,119 | 12/1986 | Thompson | 310/325 |
| 4,736,130 | 4/1988 | Puskas | 310/316 |
| 4,743,789 | 5/1988 | Puskas | 310/316 |
| 4,752,918 | 6/1988 | Boucher et al. | 310/337 |
| 4,788,992 | 12/1988 | Swainbank et al. | 134/64 R |
| 4,804,007 | 2/1989 | Bran | 134/184 |
| 4,836,684 | 6/1989 | Javorik et al. | 366/114 |
| 4,854,337 | 8/1989 | Bunkenburg et al. | 134/184 |
| 4,864,547 | 9/1989 | Krsna | 367/137 |
| 4,869,278 | 9/1989 | Bran | 134/184 |
| 4,979,994 | 12/1990 | Dussault et al. | 134/1 |
| 4,998,549 | 3/1991 | Bran | 134/184 |
| 5,037,208 | 8/1991 | Dussault et al. | 366/127 |
| 5,037,481 | 8/1991 | Bran | 134/1 |
| 5,076,854 | 12/1991 | Honda et al. | 134/1 |
| 5,090,432 | 2/1992 | Bran | 134/139 |
| 5,119,840 | 6/1992 | Shibata | 134/184 |
| 5,143,103 | 9/1992 | Basso et al. | 134/98.1 |
| 5,148,823 | 9/1992 | Bran | 134/184 |
| 5,201,958 | 4/1993 | Breunsbach et al. | 134/1 |
| 5,218,980 | 6/1993 | Evans | 134/68 |
| 5,247,954 | 9/1993 | Grant et al. | 134/184 |
| 5,276,376 | 1/1994 | Puskas | 310/317 |
| 5,286,657 | 2/1994 | Bran | 437/9 |
| 5,305,737 | 4/1994 | Vago | 601/4 |
| 5,355,048 | 10/1994 | Estes | 310/334 |
| 5,365,960 | 11/1994 | Bran | 134/184 |
| 5,462,604 | 10/1995 | Shibano et al. | 134/1 |
| 5,496,411 | 3/1996 | Candy | 134/1 |
| 5,534,076 | 7/1996 | Bran | 134/1 |
| 5,656,095 | 8/1997 | Honda et al. | 134/1 |
| 5,748,566 | 5/1998 | Goodson | 367/158 |
| 5,865,199 | 2/1999 | Pedziwiatr et al. | 134/184 |
| 5,909,741 | 6/1999 | Ferrell | 134/1 |
| 6,016,821 | 1/2000 | Puskas | 134/186 |

SECTION A - A

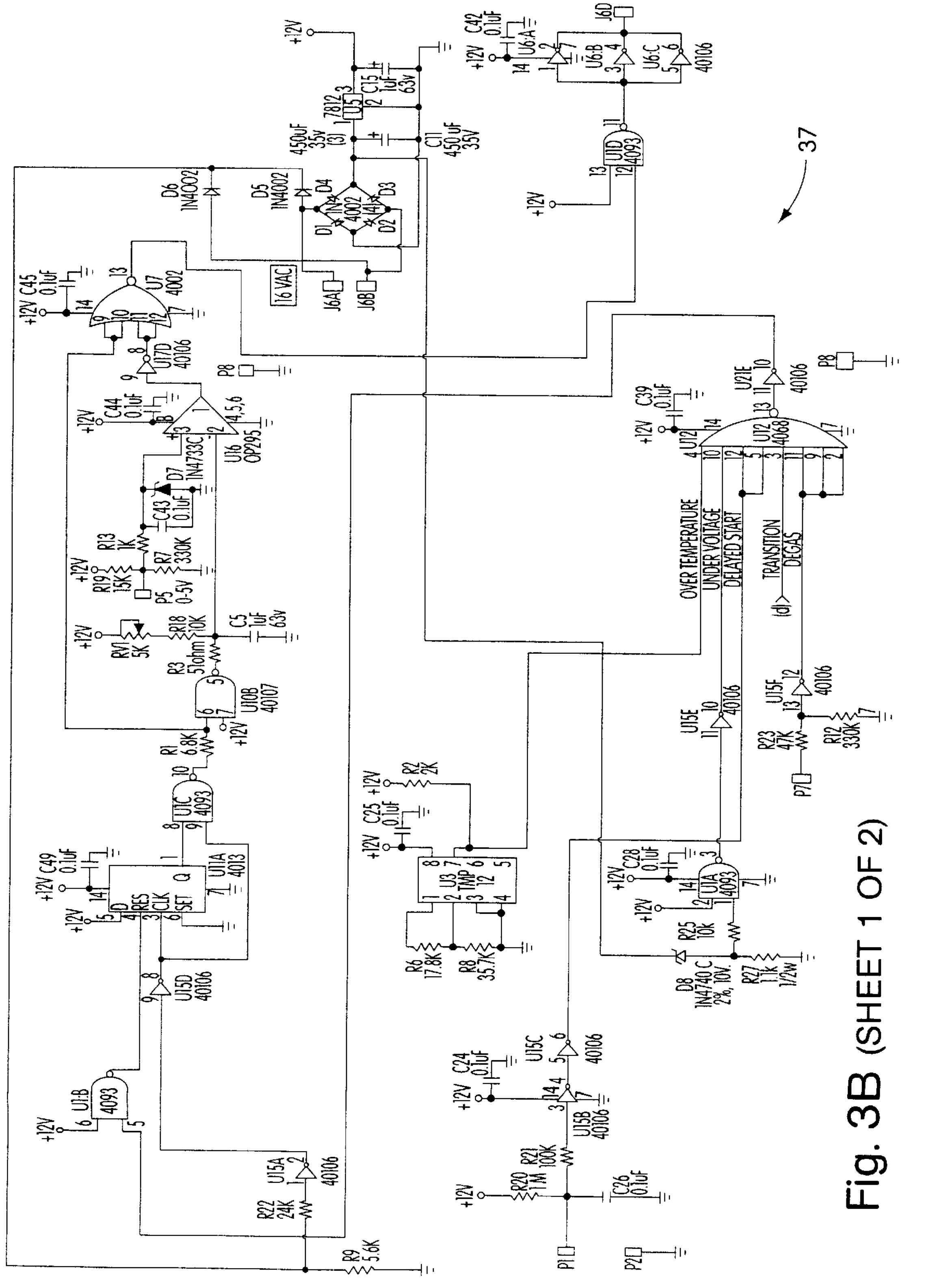
Fig. 3B (SHEET 1 OF 2)

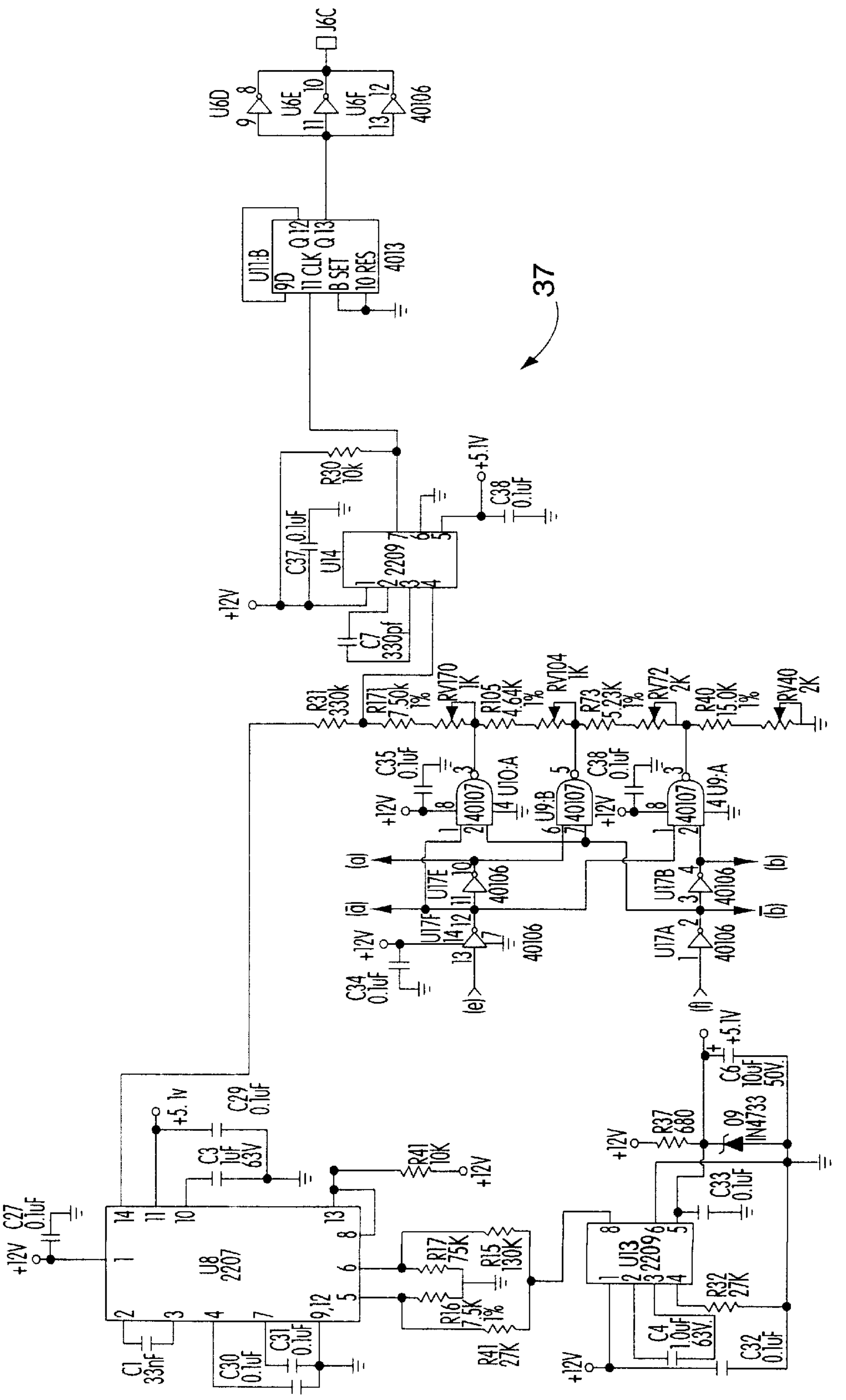
Fig. 3B (SHEET 2 OF 2)

MULTIPLE FREQUENCY CLEANING SYSTEM

CROSS-REFERENCE TO RELATED APPLICATIONS

The following pending U.S. Patent Applications are related to the present application, and are hereby incorporated by reference:

U.S. application Ser. No. 09/066,158, filed Apr. 24, 1998, entitled "Apparatus and Methods for Cleaning and/or Processing Delicate Parts"

U.S. application Ser. No. 09/370,302 filed Aug. 9, 1999, entitled "Probe System for Ultrasonic Processing Tank"

U.S. application Ser. No. 09/370,751, filed Aug. 9, 1999, entitled "Power System for Impressing AC Voltage Across a Capacitive Element"

U.S. application Ser. No. 09/371,704, filed Aug. 9, 1999, entitled "Ultrasonic Generating Unit having a Plurality of Ultrasonic Transducers"

U.S. application Ser. No. 09/370,324, filed Aug. 9, 1999, entitled "Ultrasonic Transducer with Bias Bolt Compression Bolt"

U.S. application Ser. No. 09/370,301, filed Aug. 9, 1999, entitled "Ultrasonic Transducer with Epoxy Compression Elements"

STATEMENT REGARDING FEDERALLY SPONSORED RESEARCH

Not Applicable

REFERENCE TO MICROFICHE APPENDIX

Not Applicable

BACKGROUND OF THE INVENTION

The present invention relates to ultrasound cleaning systems, and more particularly, to systems, generators and methods that clean and/or process by coupling multiple frequency sound waves into a liquid to optimize cleaning performance. This application is related to the following U.S. Patents, which are hereby incorporated by reference: U.S. Pat. No. 5,834,871, Apparatus and Methods for Cleaning and/or Processing Delicate Parts, issued Nov. 10, 1998; U.S. Pat. No. 6,002,195, Apparatus and Methods for Cleaning and/or Processing Delicate Parts, issued Dec. 14, 1999; and, U.S. Pat. No. 6,016,821, Systems and Methods for Ultrasonically Processing Delicate Parts, issued Jan. 25, 2000.

There is a 40 year history of multiple frequency cleaning or processing systems. These systems can be organized into several classes of equipment. The first class of equipment consists of a tank holding liquid with two or more transducers (or two or more transducer arrays) that couple sound energy into the tank and each of these transducers (or arrays) is driven by a different generator. Typically all the generators are operated at the same time or there is an overlap in the operating times of the generators so that two or more frequencies are simultaneously put into the tank for at least part of the cleaning or processing cycle. The chronological history of this first class of equipment starts in 1959 with U.S. Pat. No. 2,891,176 where Branson teaches three transducer arrays driven by three generators, the operation periods of these generators overlap in a way to balance the current in a transformer. In 1974 a tank was designed and built at Branson Cleaning Equipment Company that had an array of 25 kHz transducers on the bottom and a second array of 40 kHz transducers on one side; each of these arrays was simultaneously driven by the appropriate frequency generator. Similar systems were designed and built by others in the 1970's, e.g., Blackstone, but no useful application was found for the technology. In 1981 U.K. Pat. No. 2,097,890A taught three transducer arrays driven by three generators on different phases of a three-phase line. In the mid 1990's Amerimade Technology sold a system consisting of a tank with angled walls and two arrays of transducers on different walls, each array was driven by a different frequency generator, one sweeping around 71.5 kHz and the other sweeping around 104 kHz. At around the same period in time, Zenith sold a two array two generator system operating at 80 kHz and 120 kHz called "crossfire" because the different frequencies intersected at 90 degrees. Unlike the earlier 25 kHz and 40 kHz systems that found no useful application, the personal computer industry now existed and these Amerimade and Zenith systems were sold in large volume to the hard disk drive industry. In U.S. Pat. No. 5,656,095 Honda, et al. teaches high frequency transducers and low frequency transducers on the tank where the high frequency transducers are normally driven and the low frequency transducers are driven for short periods of time to intermittently destroy the high frequency bubbles. In U.S. Pat. No. 5,865,199 Pedziwatr et al. teaches two arrays of transducers interspersed on the tank and driven by two different frequency generators. In U.S. Pat. No. 5,909,741 Ferrell teaches two arrays of transducers on different angled walls of a plastic container and driven by different frequency generators.

A second class of multiple frequency cleaning equipment has one array of multiple frequency transducers that couple sound into the liquid in the tank and this array is driven by a pulse or square wave generator or some other form of shock excitation where the generator output is rich in harmonic frequencies or produces a number of integral harmonic frequencies. Multiple resonances in the multiple frequency transducer array are excited by the appropriate harmonics in the generator's output. Therefore, multiple frequencies are simultaneously coupled into the tank from a single transducer array and a single generator or multiple frequencies are combined in the tank. In U.S. Pat. No. 3,315,102 Quint et al. teaches driving a tank with simultaneous multiple frequencies through shock excitation from a spark gap generator. In U.S. Pat. No. 3,371,233 Cook teaches shock excitation of a non-symmetrical transducer to simultaneously produce many frequencies in a tank. U.K. Pat. No. 1,331,100 teaches a non-symmetrical transducer that can simultaneously vibrate at a number of different frequencies and harmonics of these frequencies. When driven by a generator with a harmonic rich output, this transducer will produce simultaneous multiple frequencies. Other transducers capable of multiple frequencies are taught by Thompson and by Goodson in U.S. Pat. Nos. 4,633,119 and 5,748,566 respectively. In U.S. Pat. No. 5,076,854 Honda, et al. teaches that rapid switching to different frequencies shocks the transducer into producing multi-frequencies in between the drive frequencies. In U.S. Pat. No. 5,462,604 Shibano et al. teaches a way to effectively produce square wave drive characteristics in the liquid by driving the transducer with odd integer multiples of the natural resonant frequency of the transducer. One disadvantage to this class of cleaning equipment is that often the resonant frequencies of the resonantor do not correspond with the harmonic peaks of the driving generator, resulting in less than optimum performance from the cleaning equipment.

A third class of multiple frequency cleaning equipment has multiple transducers (or multiple arrays of transducers), each transducer (or array) having a different frequency and a generator with multiple outputs, each output having a different frequency matched to the transducer (or array) to which it is connected. In U.S. Pat. No. 2,985,003 Gelfand et al. teaches a system where the generator can supply a number of single frequencies to the same number of transducers to set up that number of different standing wave patterns. In U.S. Pat. No. 3,746,897 Karatjas teaches a generator that is capable of supplying an integer number of different single frequencies. One specific single frequency is chosen by a switch for operation. Each specific single frequency drives a different transducer designed to operate at that specific frequency.

One disadvantage common to the above-described configurations is that often the intensity of the ultrasound delivered to the component being cleaned is insufficient for the particular, desired cleaning task.

It is an object of the present invention to substantially overcome the above-identified disadvantages and drawbacks of the prior art.

SUMMARY OF THE INVENTION

The multiple frequency invention described herein is a new class of liquid cleaning and processing equipment where there is one transducer array and one generator that produces a series string of different frequencies within two or more non-overlapping continuous frequency ranges. The transducer array is capable of responding to electrical frequency signals to produce intense sound energy at any frequency within two or more distinct frequency bands. The generator is capable of supplying an electrical frequency signal at any frequency within continuous frequency ranges contained within two or more of the transducer array's frequency bands.

The generator and transducer array produce a series string of different frequency sound waves. The first produced frequency is typically followed by a different second frequency that is in the same frequency range as the first frequency, then this second frequency is typically followed by a different third frequency that is in the same frequency range as the first two frequencies, and this pattern continues for at least the lifetime of a sound wave in the liquid (typically 20 to 70 milliseconds). This results in multiple closely related frequencies of the same frequency range adding up within the liquid to a value of high intensity sound. This high intensity multiple frequency sound field is typically maintained long enough to accomplish a specific part of the cleaning or processing cycle, then the electrical frequency signal output of the generator is controlled to jump to a frequency in a different frequency range, typically in a different frequency band, where different frequencies are again strung together for at least the lifetime of a sound wave in the liquid.

This invention is an improvement over prior art multiple frequency systems because by stringing together different frequencies from the same frequency range for at least the lifetime of a sound wave in the liquid, the sound intensity of these closely related frequencies builds up to a higher value than with any of the prior art multiple frequency systems. This higher intensity sound field does the improved cleaning or processing within the frequency range and then the system jumps to another frequency range where the cleaning or processing effect is different. Again, in the second frequency range the sound intensity builds up to a higher value than with any prior art multiple frequency system and, therefore, the improvement in cleaning or processing occurs within this second frequency range. Also, by maintaining the production of sound in each frequency range for a minimum of 20 milliseconds, there is substantially no intense sound energy produced at frequencies outside of the frequency ranges, this further adds to the build up of the intensity of the sound energy. Each of these improved effects in each of the different frequency ranges adds up to a process that is superior to prior art methods.

A variation of the invention substitutes a fraction of a cycle of a frequency strung together with other fractions of a cycle of sound at different frequencies within a given frequency range before jumping to a different frequency range. Another variation inserts a degas time between jumps from one frequency range to another. Another variation controls the generator to cycle through the frequency ranges in different orders, i.e., several permutations of the frequency ranges are introduced into the liquid during the cleaning or processing cycle. Another variation defines each permutation of a frequency range to be a cleaning packet and the order in which these cleaning packets are delivered to the liquid is varied to produce different cleaning effects. Still other variations introduce phase lock loops, duty cycle control, amplitude control, PLC control, computer control, quiet times, active power control, series resistor VCO control, DAC VCO control, cavitation probe feedback to the generator and digital code frequency selection. In general, this invention is useful in the frequency spectrum 9 kHz to 5 MHz.

The foregoing and other objects of are achieved by the invention, which in one aspect comprises a system for coupling sound energy to a liquid, including at least two transducers forming a transducer array adapted for coupling to a liquid in a container. The transducer array is constructed and arranged so as to be capable of producing intense sound energy in the liquid at any frequency within at least two non-overlapping frequency bands. The system further includes a signal generator adapted for producing a driver signal for driving the transducer array at any frequency from one or more continuous frequency ranges within each of the at least two frequency bands. The signal generator drives the transducer array to produce the intense sound energy characterized by a series string of different frequencies within one of the continuous frequency ranges. The generator further drives the transducer array to discontinuously jump amongst the frequency ranges, so as to generate intense sound energy characterized by a series string of different frequencies within at least one additional frequency range in at least one additional frequency band.

Another embodiment of the invention further includes a controller for controlling the frequency of the ultrasonic energy within the series string of different frequencies. The controller also controls a duration of each frequency in the series string.

In another embodiment of the invention, the intense sound energy in the series string of different frequencies is characterized by a staircase function.

In another embodiment of the invention, the intense sound energy in the series string of different frequencies is characterized by a series of monotonically decreasing frequencies.

In another embodiment of the invention, the series of monotonically decreasing frequencies occurs for at least ninety percent of an interval during which the transducer array couples intense sound energy to the liquid.

In another embodiment of the invention, the intense sound energy in the series string of different frequencies is characterized by a series of frequencies defined by a predetermined function of time.

In another embodiment of the invention, the intense sound energy in the series string of different frequencies is characterized by a series of frequencies swept from a first frequency to a second frequency at a constant sweep rate.

In another embodiment of the invention, the series of frequencies is swept at a non-constant sweep rate.

In another embodiment of the invention, the intense sound energy in the series string of different frequencies is characterized by a random series of frequencies.

In another embodiment of the invention, the intense sound energy in the series string of different frequencies is characterized by at least a first group of frequencies from a first frequency band, and a second group of frequencies from a second frequency band, such that at least two groups of frequencies adjacent in time are from different frequency bands.

In another embodiment of the invention, the series string of different frequencies further includes at least one degas interval between periods of time having ultrasonic energy.

In another embodiment of the invention, the intense sound energy in the series string of different frequencies is characterized by at least a first group of frequencies from a first frequency band, and a second group of frequencies also from the first frequency band, such that at least two groups of frequencies adjacent in time are from the same frequency band.

In another embodiment of the invention, the intense sound energy in each of the series string of different frequencies is characterized by at least a fraction of a cycle of the distinct frequency.

In another embodiment of the invention, the fraction of a cycle is one-half of a cycle, and each successive one-half cycle represents a different frequency.

In another embodiment of the invention, the intense sound energy includes frequencies elected from the frequency spectrum 9 kHz to 5 MHz.

In another embodiment of the invention, the frequency ranges are characterized by a center frequency. The center frequency of each higher frequency range is a non-integer multiple of the center frequency of the lowest frequency range, so as to prevent one or more Fourier frequencies of a periodic wave from forming in the liquid.

In another embodiment of the invention, the controller includes a PLC or a computer.

Another embodiment of the invention further includes a probe adapted for measuring one or more parameters associated with the liquid corresponding to sound-produced effects in the liquid. The controller alters the generator driver signal as both a predetermined function of the measured parameters, and according to the desired purpose of the system.

In another embodiment of the invention, each specific frequency range is represented by a distinct digital code. The controller initiates a transition from a first frequency range to a second frequency range in response to the digital code transitioning from a digital code representative of the first frequency range to the digital code representative of the second frequency range.

In another embodiment of the invention, the center frequency of each frequency range corresponds to an output of a voltage controlled oscillator. The output of the voltage controlled oscillator corresponds to an input control signal, and the input control signal is determined by a series string of resistors. The total string of resistors produces the lowest frequency range and each higher string of resistors produces each higher frequency range.

In another embodiment of the invention, the intense sound energy includes ultrasonic energy.

In another embodiment of the invention, the intense sound energy in the series string of different frequencies occurs continuously for at least 20 milliseconds, within each of the continuous frequency ranges.

In another embodiment of the invention, the output power level of the driver signal is actively maintained by comparing an actual output power level to a specified output power level, and adjusting parameters of the driver signal to make the actual output power level substantially equal to the specified output power level. The parameters of the driver signal may be either amplitude, duty cycle, or some combination thereof.

In another embodiment of the invention, the intense sound energy characterized by the series string of different frequencies further includes one or more quiet time intervals characterized by a substantial absence of intense sound energy.

In another embodiment of the invention, the quiet time intervals are distributed periodically among the intervals of intense sound energy. In yet another embodiment, the quiet time intervals are distributed randomly among the intervals of intense sound energy.

In another embodiment of the invention, the quiet time intervals are distributed among the intervals of intense sound energy according to a predetermined function of time.

In another embodiment of the invention, the center frequency for each frequency range is optimized by an automatic adjustment from a circuit that maintains a substantially zero phase shift between an associated output voltage and output current at the center frequency.

In another embodiment of the invention, the order of frequency range transitions varies such that several permutations of frequency ranges can be introduced into the liquid. In other embodiments, each permutation of frequency ranges is defined as a specific cleaning packet, and the order in which the cleaning packets are introduced into the liquid is changed such that each different order produces a different cleaning effect.

In another embodiment of the invention, substantially no intense sound energy is produced at frequencies outside of the frequency ranges.

In another embodiment of the invention, the container holding the liquid is constructed from materials resistant to detrimental effects of the liquids. These materials may include tantalum, polyetheretherketone, titanium, polypropylene, Teflon, Teflon coated stainless steel, or combinations thereof, or other similar materials known to those in the art.

In another embodiment of the invention, the signal generator is capable of producing any of an infinite number of frequencies contained within each of the unconnected continuous frequency ranges.

In another embodiment of the invention, the signal generator produces an output signal including the FM information for synchronizing other generators or power modules.

In another embodiment of the invention, the center frequency of each frequency range corresponds to an output of a voltage controlled oscillator. The output of the voltage controlled oscillator corresponds to an input control signal, and the input control signal is generated by a DAC (digital-to-analog converter). In other embodiments, the digital input to the DAC produces a stepped staircase analog output from the DAC, resulting in a stepped, staircase sweeping function within a frequency range. In yet another embodiment, the digital input to the DAC produces a random staircase analog output from the DAC, resulting in a random staircase sweeping function within a frequency range.

In another aspect, the invention comprises a system for coupling sound energy to a liquid. The system includes at least two transducers forming a transducer array adapted for coupling to a liquid in a tank, and the transducer array is constructed and arranged so as to be capable of producing intense sound energy in the liquid at any frequency within at least two non-overlapping frequency bands. The system further includes a signal generator adapted for producing a driver signal for driving the transducer array at any frequency from one or more continuous frequency ranges within each of the at least two frequency bands. The signal generator drives the transducer array so as to produce intense sound energy characterized by a plurality of changing frequencies within a first frequency range, followed by a plurality of changing frequencies within a second frequency range. The system so operating reduces a strong antinode below the liquid-to-air interface.

In another aspect, the invention comprises a system for coupling sound energy to a liquid, that includes at least two transducers forming a transducer array adapted for coupling to a liquid in a tank. The transducer array is constructed and arranged so as to be capable of producing intense sound energy in the liquid at any frequency within at least two distinct frequency bands. The system further includes a signal generator adapted for producing a driver signal for driving the transducer array at any frequency from one or more continuous frequency ranges within each or the at least two frequency bands. The center frequencies of the higher frequency ranges are non-integer multiples of the center frequency of the lowest frequency range to prevent two or more Fourier frequencies of a periodic wave from forming in the liquid. The signal generator drives the transducer array to produce sound energy corresponding to a first set of frequencies from a first frequency range, then produces sound energy corresponding to a second set of frequencies from a second frequency range. The transition from the first frequency range to the second frequency range is discontinuous and occurs after a time interval at least as long as the lifetime of sound energy in the container for frequencies from the first frequency range. The sound energy corresponding to the second set of frequencies continues for a time interval at least as long as the lifetime of sound energy in the container for frequencies from the second frequency range.

In another aspect, the invention comprises multiple frequency generator capable of producing an output signal characterized by any frequency within two or more non-contiguous, continuous frequency ranges. The generator is controlled to change the frequency within a frequency range, and then to change frequencies from one frequency range to a second frequency range before beginning the changing of frequencies in this second frequency range.

In another aspect, the invention comprises a method of delivering multiple frequencies of intense sound waves to a liquid. The method includes the step of coupling to the liquid an array of transducers that are capable of producing sound energy in the liquid at an infinite number of different frequencies contained within two or more non-contiguous, continuous frequency bands. The method also includes the step of driving the transducer array with a generator capable of producing substantially all of the frequencies within continuous frequency ranges contained within two or more of the transducer array frequency bands. The method further includes the step of controlling the generator so that the produced frequencies change within the frequency ranges according to a function of time, and the frequencies jump amongst the frequency ranges.

BRIEF DESCRIPTION OF DRAWINGS

The foregoing and other objects of this invention, the various features thereof, as well as the invention itself, may be more fully understood from the following description, when read together with the accompanying drawings in which:

FIG. 3B shows, in schematic form, additional components of the generator of FIG. 3A;

DESCRIPTION OF THE PREFERRED EMBODIMENTS

As used herein, "lifetime" of a sound wave in a liquid contained in a tank or other container is defined as the time for the sound wave to decay from 90% to 10% of its intensity value after the sound energy input to the tank or container is stopped. Lifetime is a function of the sound frequency, type of liquid, shape and material of the container, and loading of the container.

As used herein, “degas time”, “quiet time”, “transition time” and “off time” are periods of time when the generator is supplying no electrical frequency drive signal to the array of transducers.

As used herein, “permutations of frequency ranges” means different orders of supplying the frequency ranges to the liquid. For example, if there are four frequency ranges, there are twenty-four permutations of these four frequency ranges.

As used herein, “cleaning packet” is defined as a permutation of frequency ranges.

As used herein, “intense” sound energy is defined as sound energy having an amplitude suitable for cleaning and processing components; such amplitudes typically produce cavitation as is well known to those in the art.

As used herein, “frequency band” is defined as a continuous set of frequencies over which a transducer array can generate intense sound energy. These frequency bands are typically located around the fundamental frequency and the harmonics of the transducer array.

Figures 1A, 1B, 1C:
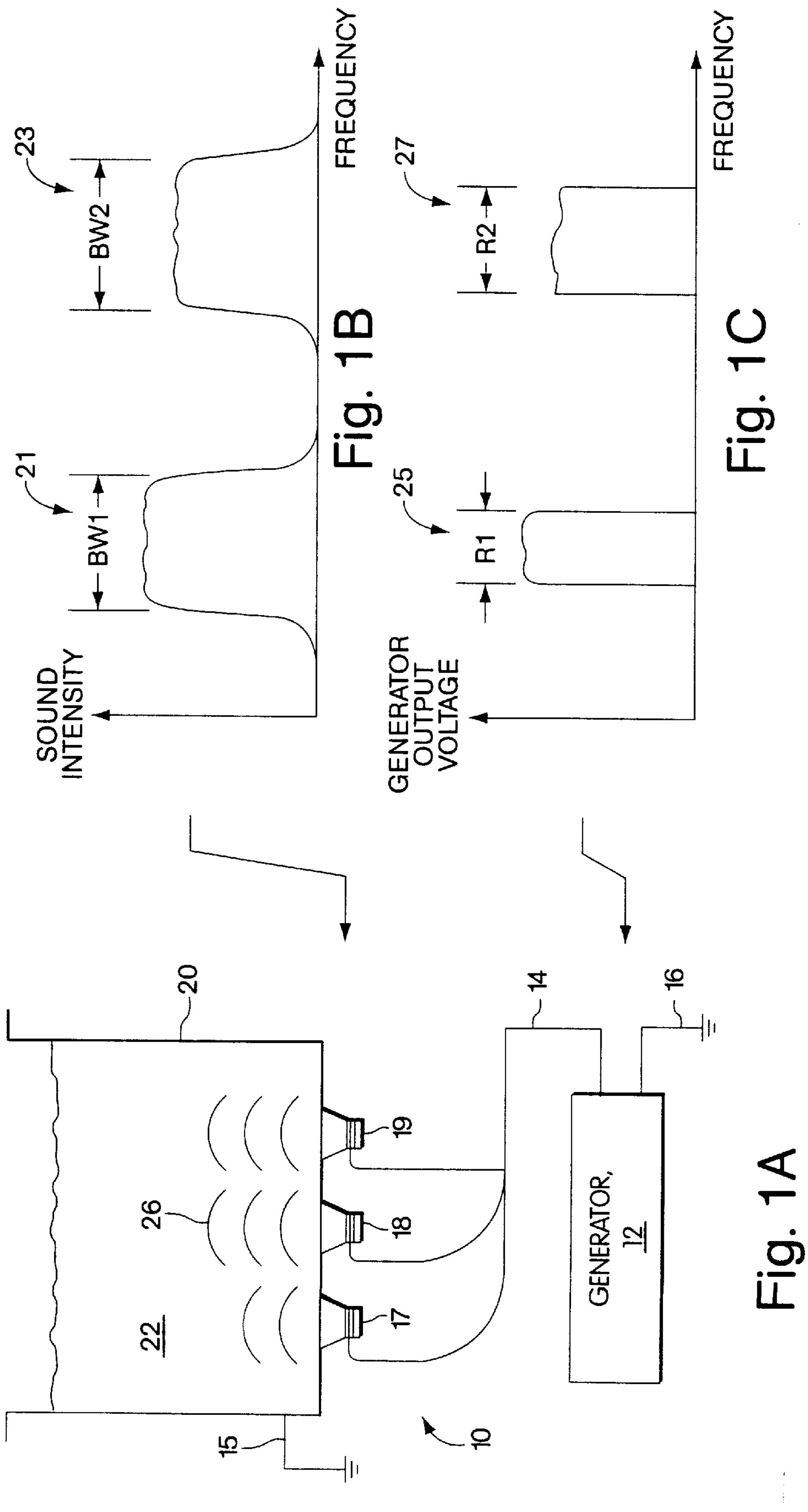
FIG. 1A shows in diagram form the multiple frequency system according to the present invention.
FIG. 1B shows, in graphical form, characteristics of the transducer array of FIG. 1A.
FIG. 1C shows, in graphical form, characteristics of the generator of FIG. 1A.

FIG. 1A shows a diagram of a multiple frequency cleaning system 10 constructed according to the present invention. A signal generator 12 (also referred to herein as ‘generator’) connects via electrical paths 14, 15, 16 to a transducer array consisting of paralleled transducers 17, 18, 19. The transducer array is driven by the generator 12 to produce multiple frequency sound waves 26 in liquid 22 which is contained in tank 20. Tank 20 is typically constructed of 316L stainless steel, but other tanks or containers such as those constructed of tantalum, polyetheretherketone, titanium, polypropylene, Teflon, Teflon coated stainless steel, or other material or combination of materials can be used. These alternate materials are most appropriate when the liquid 22 is an aggressive chemistry that will degrade or erode 316L stainless steel.

FIG. 1B shows a graph of the sound intensity produced by the transducer array verses the frequency of the sound. BW1 21 is a first frequency band of frequencies produced by the transducer array and BW2 23 is a second frequency band of frequencies produced by the transducer array. Since these frequency bands are continuous along the frequency axis, there are an infinite number of frequencies contained in each frequency band that can be excited by the generator. The first frequency band typically occurs around the fundamental frequency of the transducer and the other frequency bands typically occur around the transducer harmonics. It is possible to not use the frequency band around the fundamental frequency and to select two or more of the frequency bands around harmonic resonances for the operating areas of the transducer array.

FIG. 1C shows a graph of the generator output voltage verses frequency. R1 25 is a first range of frequencies produced by the generator, with R1 25 being a frequency subset of BW1 21. R2 27 is a second range of frequencies produced by the generator, with R2 27 being a frequency subset of BW2 23.

Figure 2:
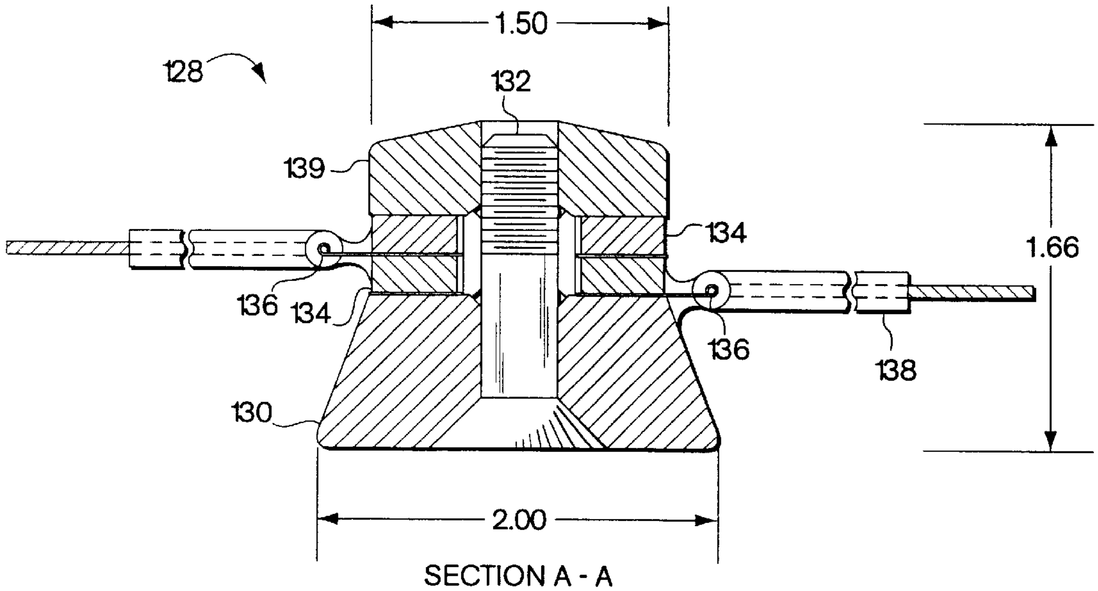
FIG. 2 shows a sectional view (section AA) of the transducer of FIG. 2A.
Figure 2A:
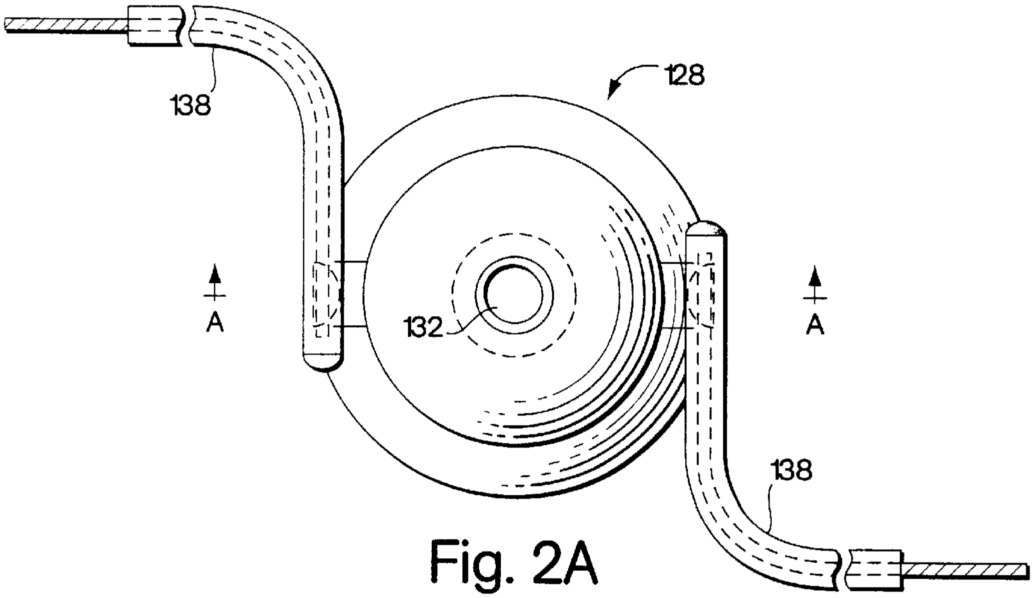
FIG. 2A shows a top view of one transducer of an array from FIG. 1A that exhibits multiple frequency band characteristics; e.g., frequency bands are centered on 39.75 kHz, 71.5 kHz, 104 kHz, 131.7 kHz, 167.2 kHz and 250.3 kHz.

FIG. 2 shows a cross-sectional view of one transducer 128 constructed according to the invention; while FIG. 2A shows a top view of the transducer 128. Two or more transducers are connected in parallel to form an array of transducers. The parallel array of transducers formed from transducers 128 exhibit frequency bands that are centered on 39.75 kHz, 71.5 kHz, 104 kHz, 131.7 kHz, 167.2 kHz and 250.3 kHz.

In FIGS. 2 and 2A, the ceramic 134 of transducer 128 is driven through oscillatory voltages transmitted across the electrodes 136. The electrodes 136 connect to a generator (not shown), such as described above, by insulated electrical connections 138. The ceramic 134 is held under compression through operation of the bolt 132 providing compressive force by way of the front driver 130 and the back mass 139.

Figure 3A:
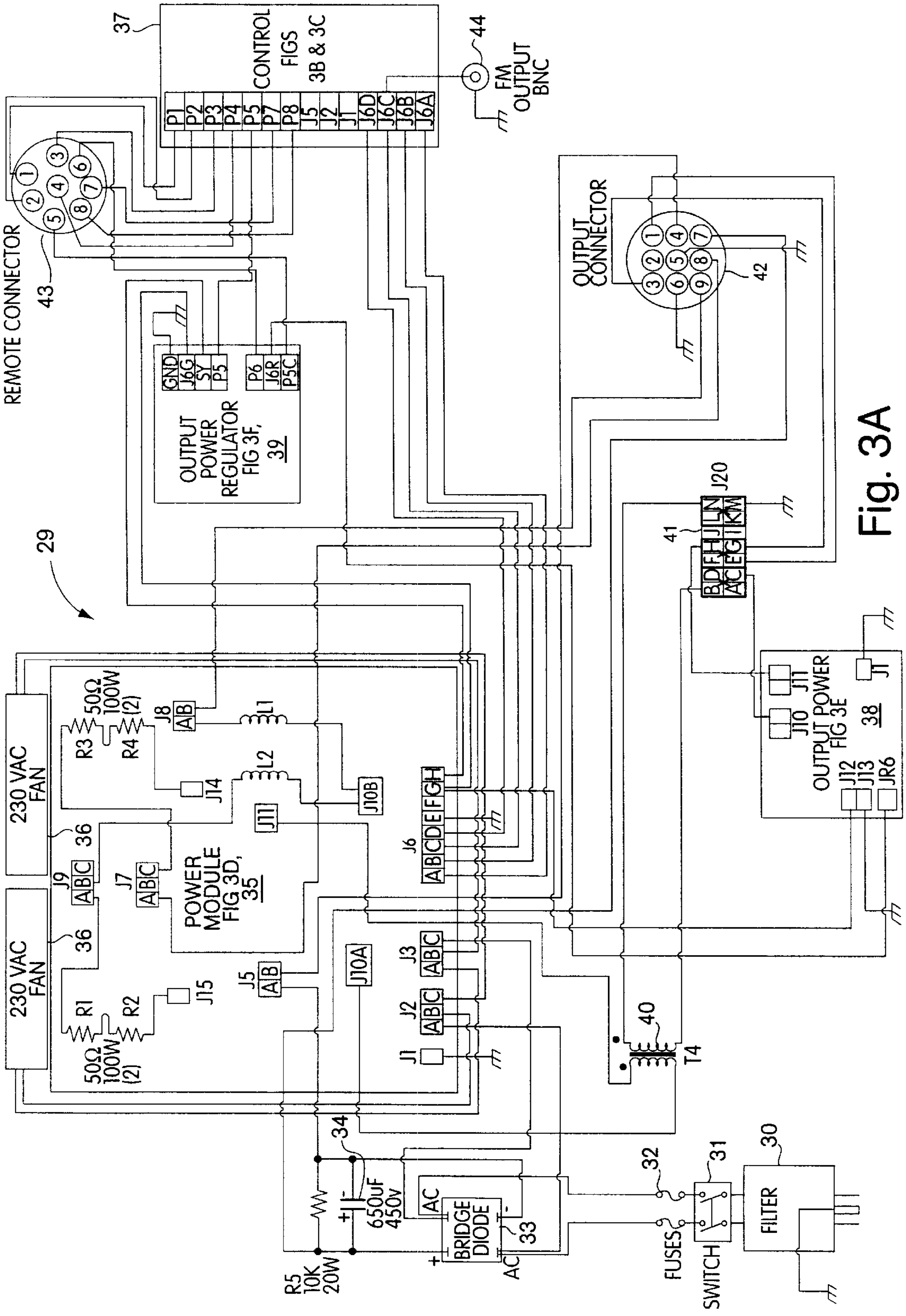
FIG. 3A shows, in schematic form, a portion of a generator built to produce multiple frequency drive signals for an array of transducers formed from paralleled transducers of FIG. 2.

FIG. 3A shows the basic schematic for a generator 29 built according to the invention, with FIGS. 3B, 3C, 3D, 3E and 3F showing the component details of the circuit blocks in FIG. 3A. The generator 29 receives AC power from the power line into filter 30, the purpose of filter 30 is to prevent high frequency noise voltages produced by the generator from entering the AC power lines. Switch 31 controls the AC power to generator 29 and fuses 32 protect the system from over current conditions. Bridge diode 33 in combination with filter capacitor 34 converts the AC line voltage to a DC voltage. The power module 35 converts the DC voltage to the needed frequencies to drive the transducer array (not shown) as described above. The control 37 supplies the frequency modulation (FM) and the amplitude modulation (AM) information to the power module 35. The output power circuit 38 measures the power delivered to the transducer array and supplies this information to the output power regulator 39. The output power regulator 39 compares the signal from output power circuit 38 with the desired output power supplied through pin 5 of remote connector 43 and supplies the difference information to control 37 so the AM can be adjusted to make the actual output power substantially equal to the desired output power.

In FIG. 3A BNC connector 44 supplies the FM information to other generators (often called power modules) that need to be synchronized with this generator 29 for the purpose of eliminating beat frequencies. Terminal 41 serves as a junction connection for the power output lines. Transformer 40 isolates the generator 29 from the transducer array and output connector 42 supplies the output drive signals to the transducer array.

Figure 3C:
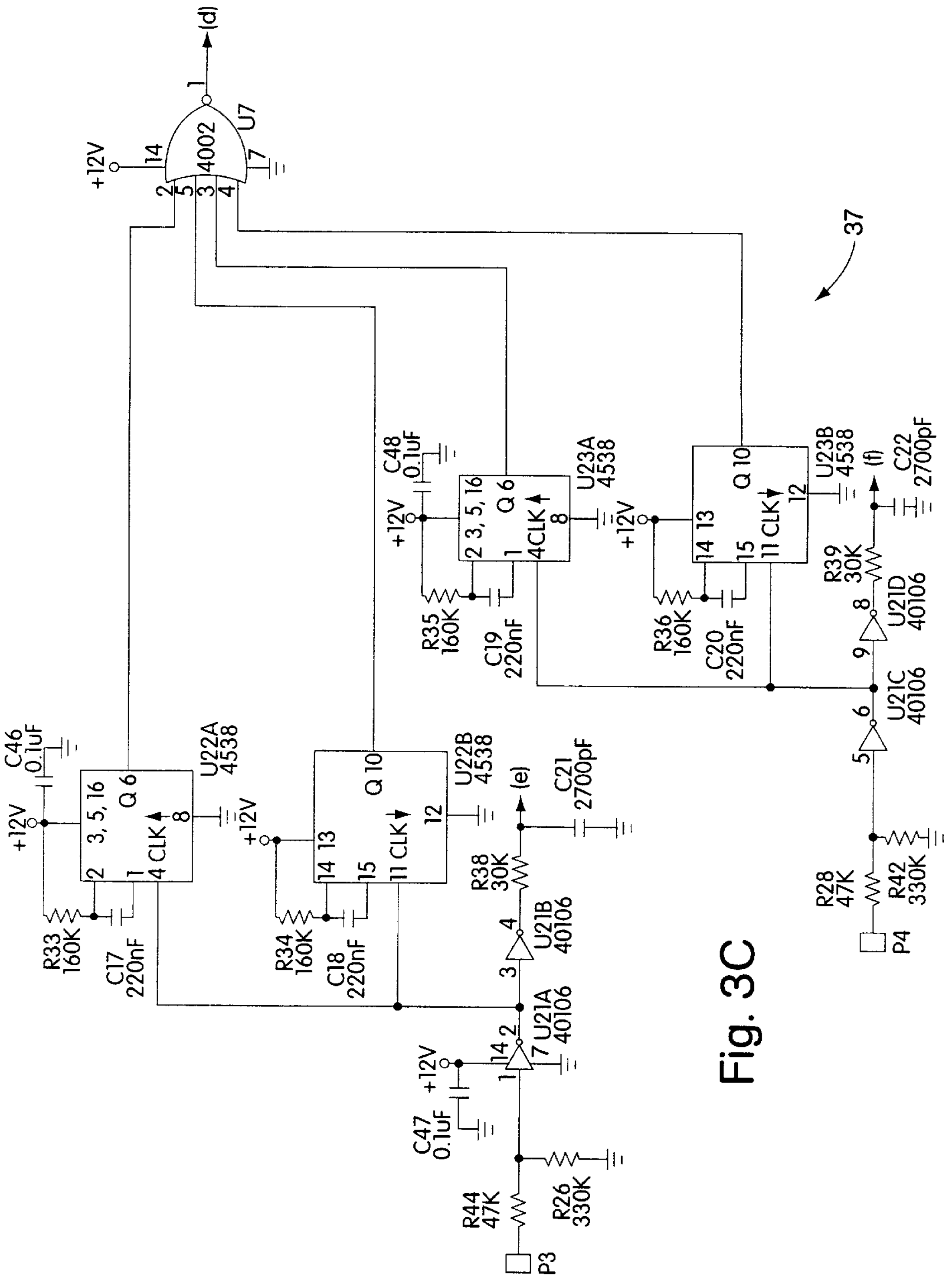
FIG. 3C shows, in schematic form, additional components of the generator of FIG. 3A.

FIGS. 3B and 3C show in schematic form the component details of control 37. VCO (voltage controlled oscillator) U13 produces a triangle wave at output pin 8 that sweeps the sweep rate signal generated by VCO U8. Besides generating the sweep rate signal, U8 also makes this sweep rate signal non-symmetrical so that most of the time (greater than 90%) the sweep rate is from high frequency to low frequency so the transducers substantially respond to a monotonic frequency change direction. VCO U14 generates two times the needed drive frequency from the sweeping information produced by U13 and U8 and from the binary code supplied to P3 and P4 in FIG. 3C. The specific binary code and center frequencies (after the U11:B divide by two flip flop) for the component values shown in FIGS. 3B and 3C are when P3,P4 are 1,1 the center frequency is 39.75 kHz, when P3,P4 are 0,1 the center frequency is 71.5 kHz, when P3,P4 are 1,0 the center frequency is 104 kHz and when P3,P4 are 0,0 the center frequency is 167.2 kHz. The series string of resistors consisting of RV40, R40, RV72, R73, RV104, R105, RV170 and R171 determine the center frequency of the signal from pin 7 of U14 by responding to the binary code. For example, when P3,P4 are 1,1 output pin 3 of gate U10:A is an open circuit, output pin 5 of gate U9:B is an open circuit and output pin 3 of gate U9:A is an open circuit. This results in the total series string of resistors RV40, R40, RV72, R73, RV104, R105, RV170 and R171 being connected to pin 4 of U14 and this produces the center frequency two times 39.75 kHz. As a second example, when P3,P4 are 0,1 output pin 3 of gate U10:A is an open circuit, output pin 5 of gate U9:B is an open circuit and output pin 3 of gate U9:A is a short circuit. This results in the resistors RV40 and R40 being shorted out and now the series string of resistors RV72, R73, RV104, R105, RV170 and R171 are connected to pin 4 of U14 and this produces the center frequency two times 71.5 kHz. As a third example, when P3,P4 are 1,0 output pin 3 of gate U10:A is an open circuit, output pin 5 of gate U9:B is a short circuit and output pin 3 of gate U9:A is a open circuit. This results in the resistors RV40, R40, RV72 and R73 being shorted out and now the series string of resistors RV104, R105, RV170 and R171 are connected to pin 4 of U14 and this produces the center frequency two times 104 kHz. And lastly as a forth example, when P3,P4 are 0,0 output pin 3 of gate U10:A is a short circuit, output pin 5 of gate U9:B is a open circuit and output pin 3 of gate U9:A is a open circuit. This results in the resistors RV40, R40, RV72, R73, RV104 and R105, being shorted out and now the series string of resistors RV170 and R171 are connected to pin 4 of U14 and this produces the center frequency two times 167.2 kHz. The frequency is continually changing around the chosen enter frequency by the current input from R31 which is connected to U14 pin 4. The current into R31 is a result of the sweeping of the sweep rate signal produced by VCOs U13 and U8 as described above. U11:B divides by two the frequencies produced by U14 and this is inverted by U6D, U6E and U6F before being output to J6C for connection to the power module 35 as shown in FIG. 3A.

It should be noted that the center frequencies of this design are not integer multiples of the lowest (fundamental) frequency. The integer multiples of 39.75 kHz are 79.5 kHz, 119.25 kHz, 159 kHz, 198.75 kHz, 238.5 kHz, 278.25 kHz, etc. None of these integer multiples are equal to the center frequencies of this design or the complete set of center frequencies possible with the transducer design in FIGS. 2 and 2A, i.e., 39.75 kHz, 71.5 kHz, 104 kHz, 131.7 kHz, 167.2 kHz and 250.3 kHz. This eliminates the possibility of generating the components of a Fourier series and therefore prevents the possibility of a periodic wave that can damage a part by exciting it into resonance.

It should also be noted that rather than a binary code to specify the frequency ranges, it is possible to use a BCD code or any other digital code to specify the frequency ranges. It is also possible to accomplish the same selection function with an analog level, for example, the analog level could be put into a ADC (analog to digital converter) and the ADC output could be used to drive the binary selection circuitry.

The FIG. 3B (sheet 1 of 2) is a schematic of that part of control 37 that generates an AM signal on J6D which is output to the power module 35 for the following purposes: to control the output power of the generator; to allow the insertion of quiet times, degas times, transition times and off times into the generator output; to shut the generator off in the event of a fault condition such as low voltage or over temperature; and to start the generator up safely in the correct logic states. The power is controlled by a zero to five volt level on P5. This voltage feeds the plus input to operational amplifier U16 that compares this voltage to the ramp voltage on the operational amplifier's minus input. The ramp is formed by RV1, R18 and C5 and it is reset by U10B. When the ramp voltage exceeds the voltage level on P5, the output of the operational amplifier U16 changes from +12 VDC to zero, this ripples through four gates that invert the signal four times and therefore a zero is on J6D which terminates the sound burst at the correct time to control the power to the level specified by the voltage on P5. The insertion of quiet times, degas times, transition times and off times into the generator output are accomplished by setting the appropriate input to NAND gate U12 to a zero. A change in the binary code to P3 or P4 in FIG. 3C causes a transition time zero to occur on input pin 3 of U12. A 12 to 50 VDC signal on P7 causes a zero on pin 11 of U12 for the insertion of a quiet time, degas time or off time. Zero inputs to the appropriate inputs of U12 are also the way fault signals shut down the generator. A low voltage on the power lines causes Schmitt trigger U1A pin 1 to go low which results in a zero on pin 10 of U12. An over temperature condition is sensed by U3 and it puts out a zero to pin 4 of U12 when this over temperature condition occurs. The generator is allowed to assume all the correct logic states by the delayed start hold off caused by R20 and C26.

FIG. 3C has four monostable multivibrators that introduce a degas time or off time between discontinuous jumps from one frequency range to the next frequency range. These degas times allow the sound waves from the prior frequency range to decay before sound waves from the new frequency range are introduced into the liquid. This is accomplished in the FIG. 3C schematic section of control 37 by any transition on the binary input lines P3 and/or P4 causing a transition on at least one of the monostable multivibrators U22A, U22B, U23A or U23B producing an output pulse the length of the degas time. This pulse travels through U7 and feeds pin 3 of U12 in FIG. 3B (sheet 1 of 2) where the AM is shut down for the length of the degas pulse.

Figure 3D:
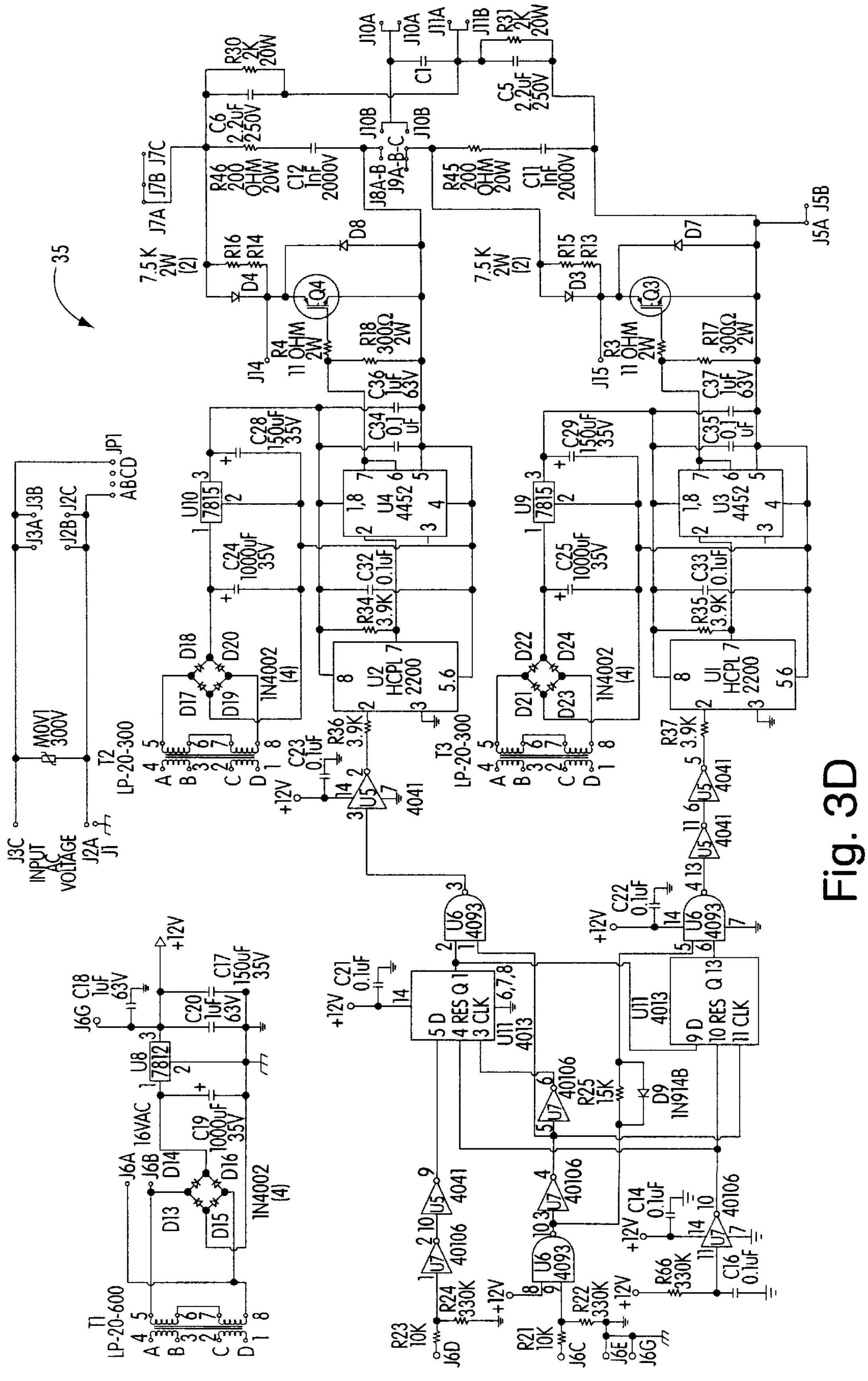
FIG. 3D shows, in schematic form, additional components of the generator of FIG. 3A.

FIG. 3D is a schematic of the power module 35.

The front end logic consisting of U5, U6, U7and U11 accepts and synchronizes the FM and AM signals from the control 37. The power section of power module 35 converts the synchronized FM and AM signals to levels appropriate for driving the transducers. This power section will respond to the infinite number of different frequencies that are possible with this multiple frequency system. The power circuit is well known to people skilled in the art and is described in U.S. Pat. No. 4,743,789.

Figure 3E:
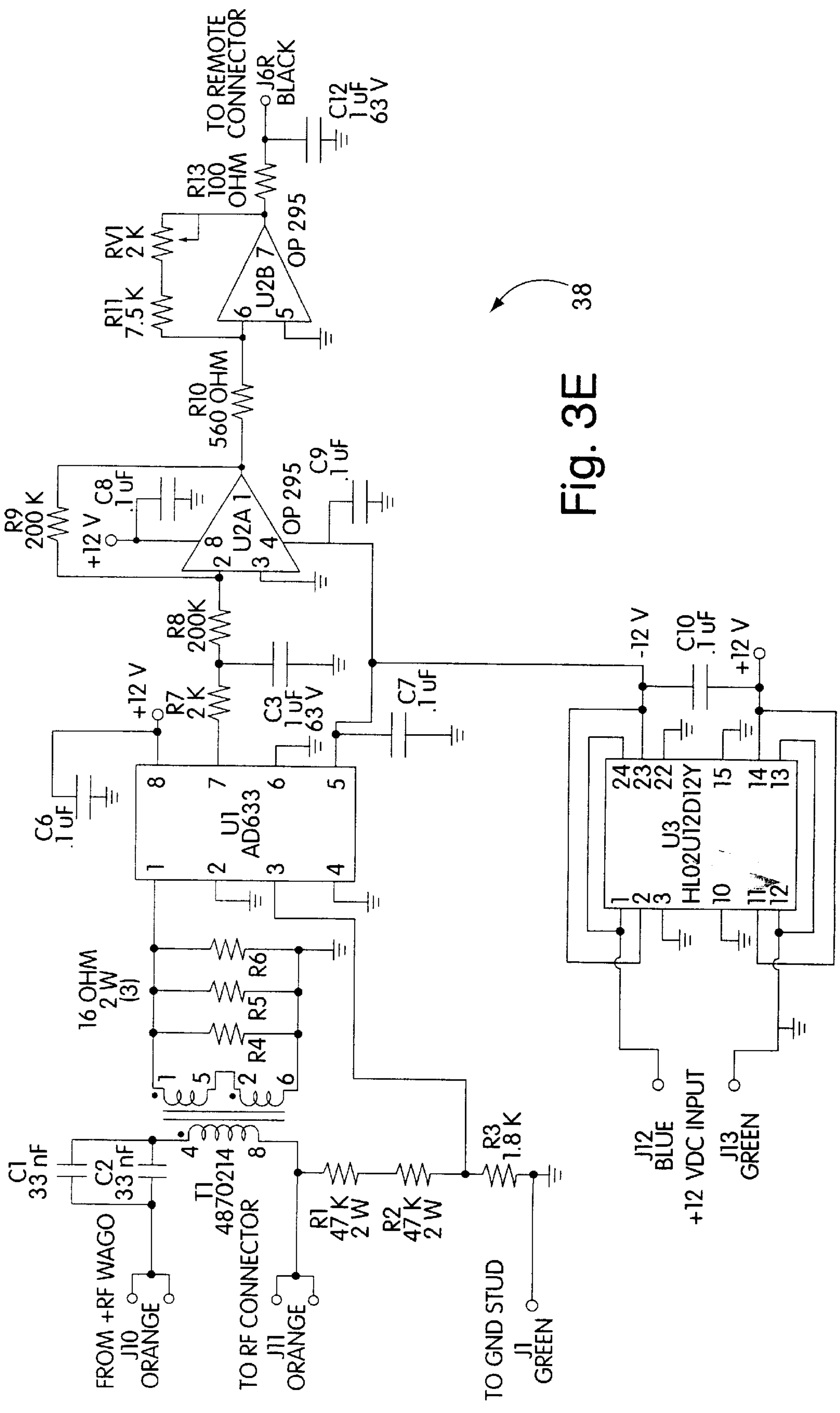
FIG. 3E shows, in schematic form, additional components of the generator of FIG. 3A.

FIG. 3E is a schematic of the circuit that measures the output power of the of generator 29. This output power circuit 38 senses the time function of the generators output voltage (Vt) and senses the time function of the generators output current (It). These functions Vt and It are multiplied, averaged over time and scaled to get the output power of the generator which is supplied to J6R as a voltage signal scaled to 100 watts per volt.

Figure 3F:
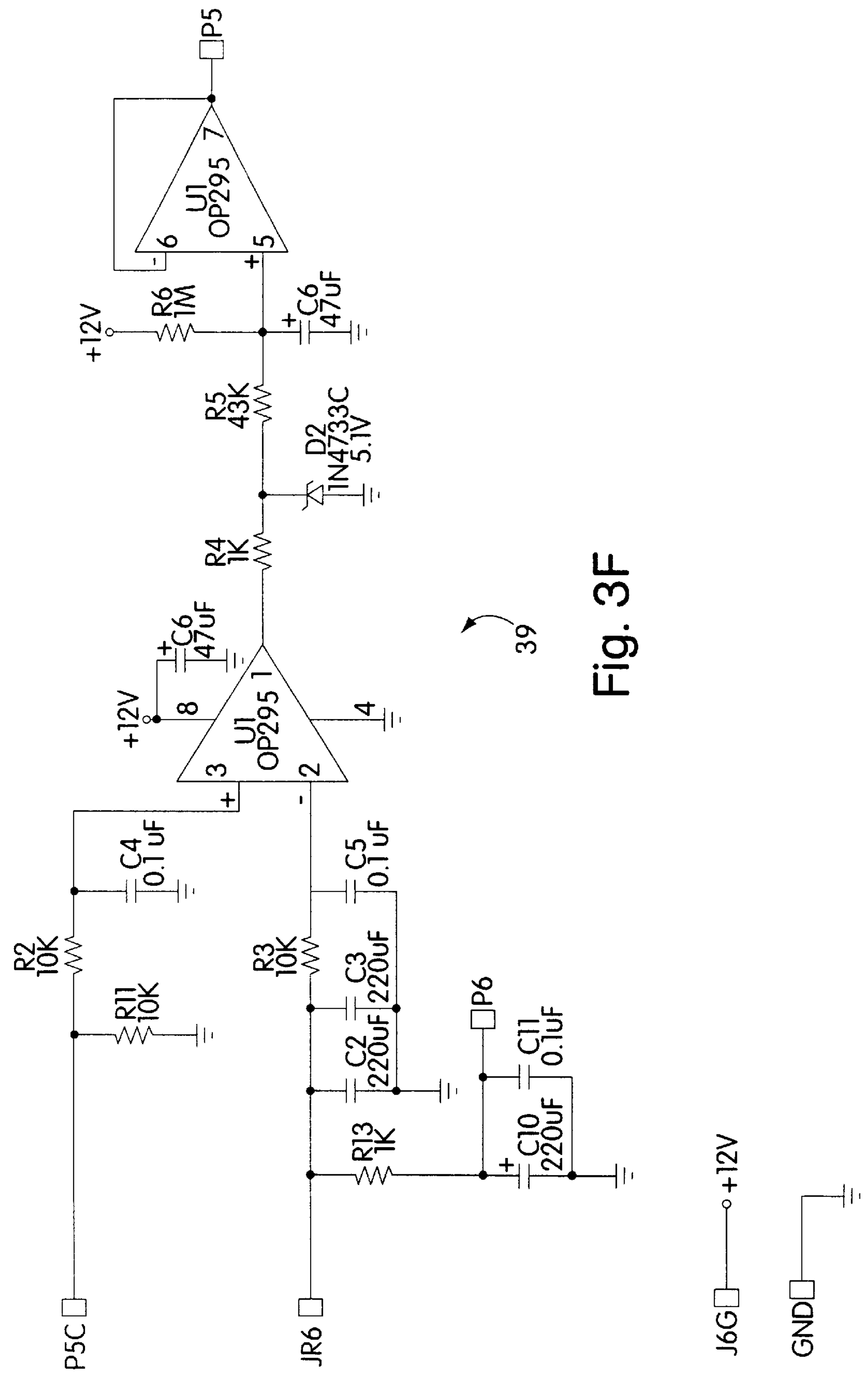
FIG. 3F shows, in schematic form, additional components of the generator of FIG. 3A.

FIG. 3F is a schematic of the output power regulator 39. A voltage (Vd) representing the desired output power is input to P5C. This is compared to the voltage (Va) representing the actual output power on JR6 (which came from the output of the output power circuit 38 as shown in FIG. 3A). If Vd is higher than Va, the voltage output on P5 increases which increases the actual output power of the generator until Va is substantially equal to Vd. If Vd is less than Va, then the output voltage on P5 is decreased until the actual output power becomes substantially equal to the desired output power.

Figure 4:
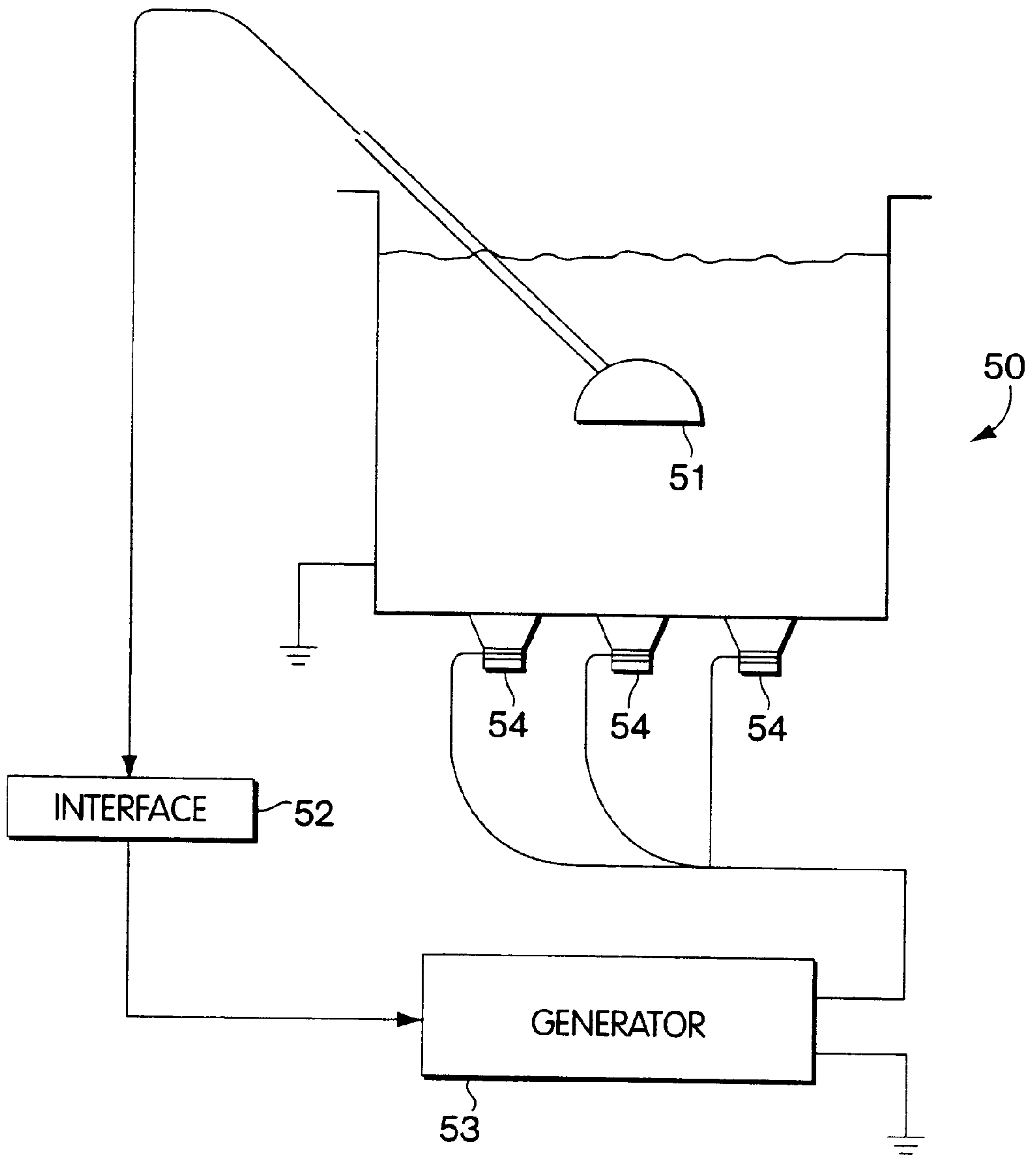
FIG. 4 shows, in diagram form, a multiple frequency system according to the present invention, controlled by a probe measuring sound characteristics in the liquid.

FIG. 4 is the system 10 in FIG. 1A with a probe 51 sensing the sound characteristics in the tank to form the feedback system 50 of FIG. 4. The probe can be of the form disclosed in U.S. application Ser. No. 09/370,302 filed Aug. 9, 1999, entitled "Probe System for Ultrasonic Processing Tank" and after proper interfacing 52 signals are sent to the remote connector on generator 53 to modify the output drive to transducer array 54. In the most sophisticated applications, the interface 52 is a PLC (programmable logic controller) or a computer that is properly programmed.

Figure 5:
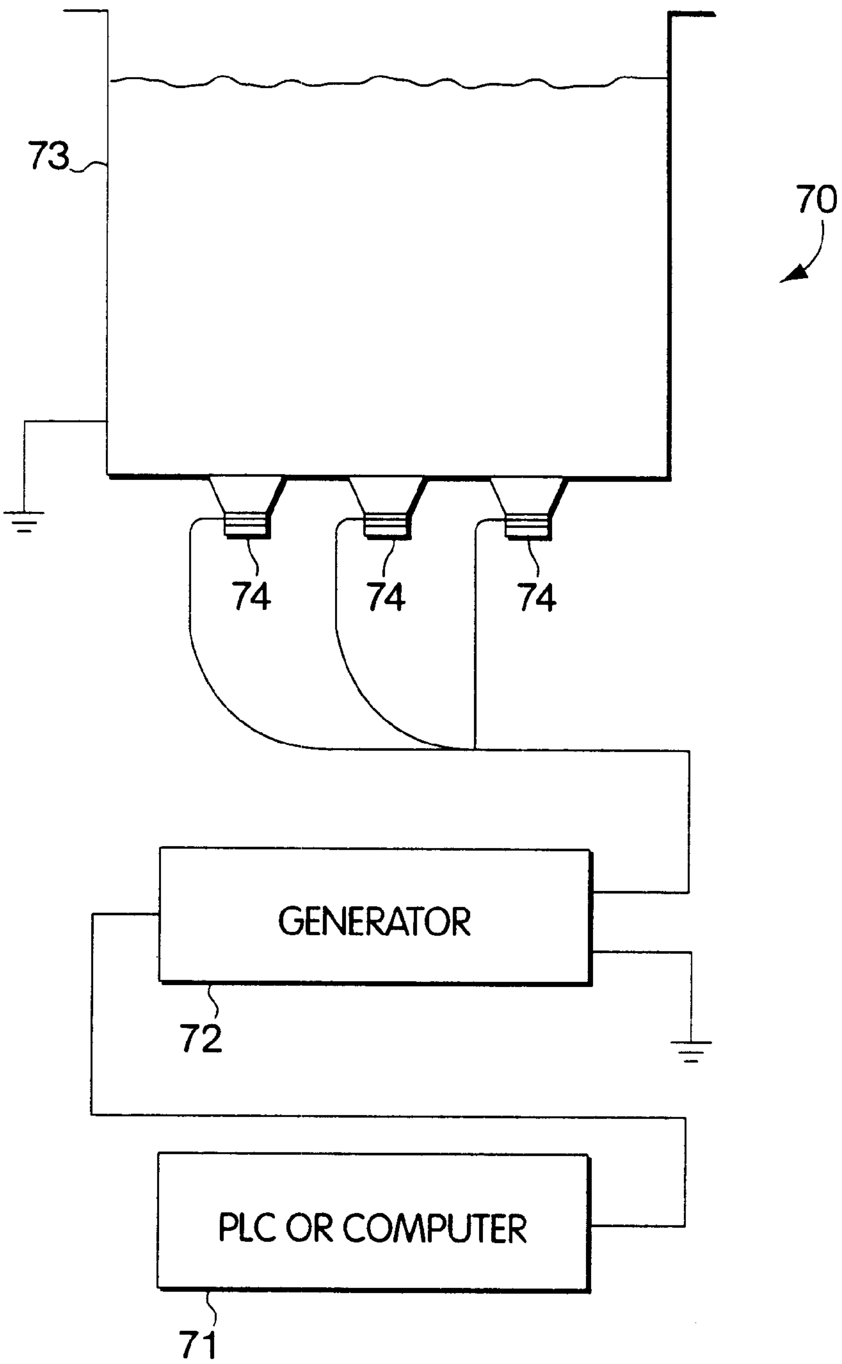
FIG. 5 shows the multiple frequency system of FIG. 1A, controlled by a PLC or a computer.

The system 70 in FIG. 5 has a PLC or a computer 71 that is programmed to control and set the parameters for generator 72. The programmed parameters are output by the generator 72 to drive the transducers 74 which put sound with the programmed characteristics into tank 73.

Figure 6:
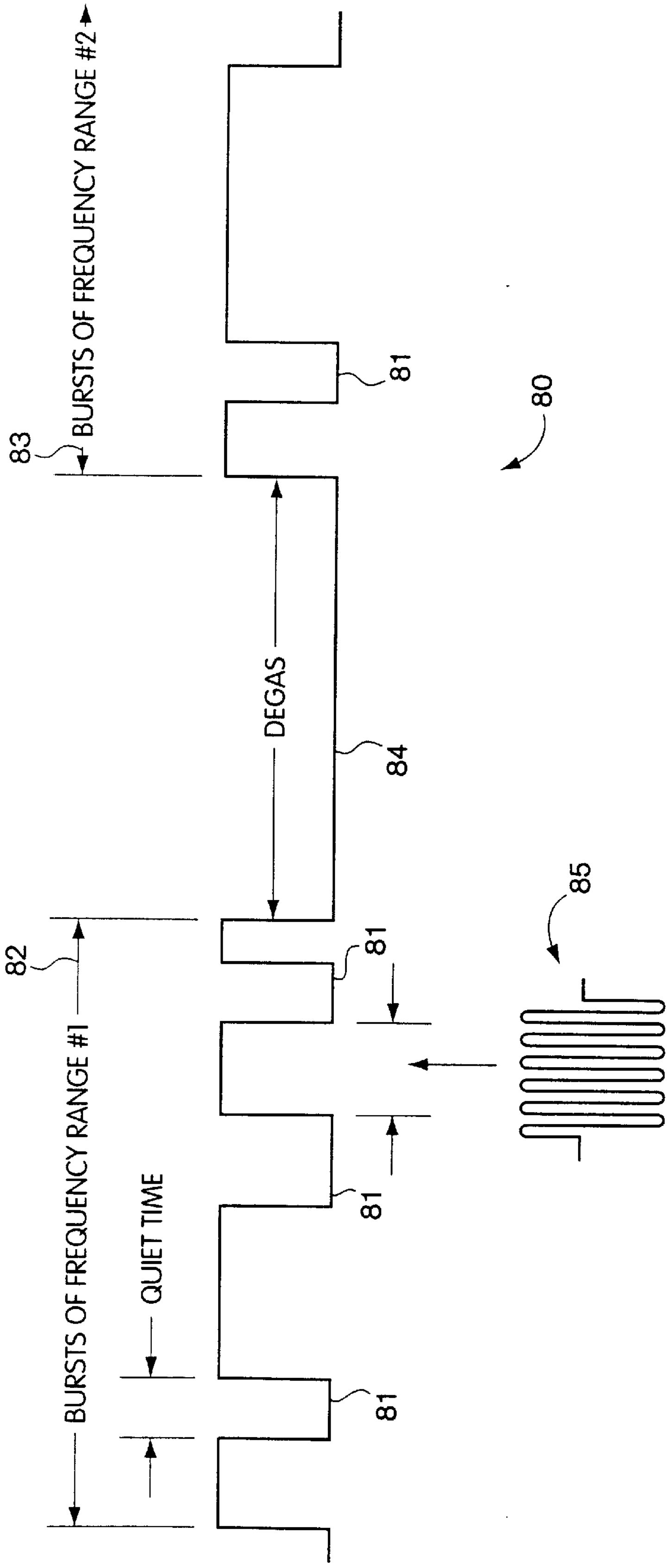
FIG. 6 shows a typical sound profile of the system of FIG. 1A, where quiet times are inserted into the bursts of sound energy.

FIG. 6 shows the addition of quiet times 81 into a typical AM pattern 80 of this invention. The invention produces continuously changing sound at frequencies in a first range of frequencies 82 before jumping to frequencies in a second range of frequencies 83. Quiet times 81 are inserted into the continuously changing frequency signal produced by the generator within a frequency range to break up the signal into smaller bursts of sound 85 for the purpose of optimizing certain processes such as the development of photosensitive polymers.

Figure 7:
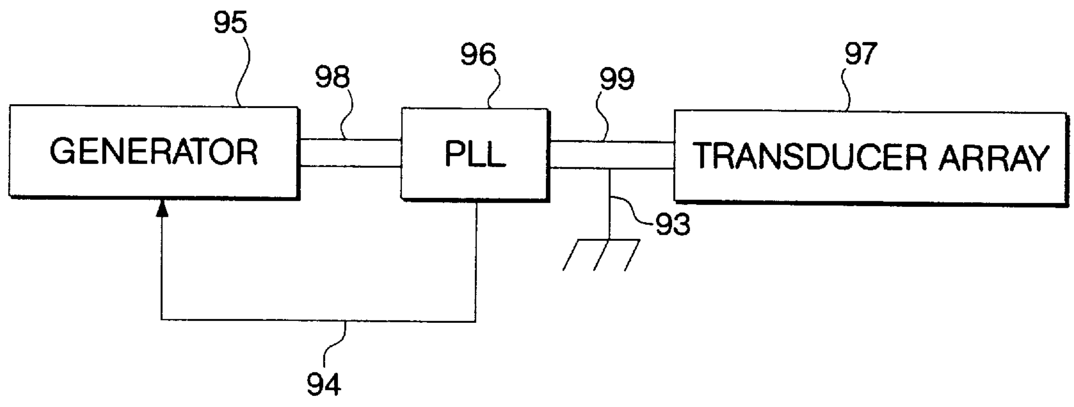
FIG. 7 shows a block diagram of the generator according to the present invention, with phase lock loop control.

FIG. 7 shows the addition of a PLL 96 (phase lock loop) to the generator 95 for the purpose of making adjustments to the center frequency of each frequency range to track changes in the resonance of the transducer array 97. The PLL 96 senses the current between line 98 and line 99 and the PLL senses the voltage between line 99 and ground 93. The PLL generates a signal on line 94 that feeds the generator 95 VCO so that the sensed current becomes in phase with the sensed voltage at the center frequency of the range.

A further advantage of this multiple frequency system is that it can reduce the intense cavitation region that occurs just below the liquid air interface. The location of this region is frequency dependent, therefore, by jumping from one frequency range to another, the intense region changes position and is averaged over a larger area.

Figure 8A:
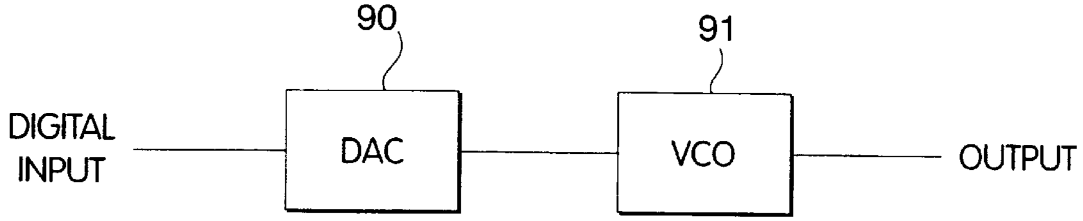
FIG. 8A shows a VCO controlled by a DAC according to the present invention, to change the frequencies of the generator.
Figure 8B:
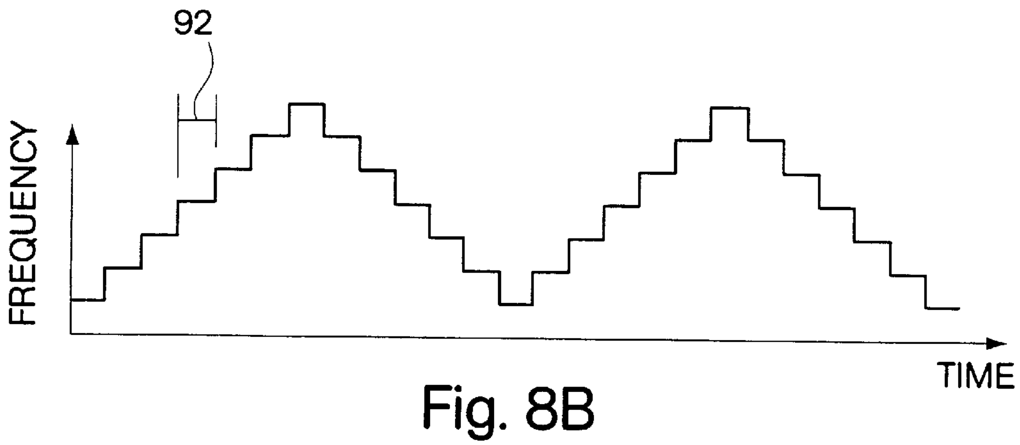
FIG. 8B shows an example of a staircase function that can result from the DAC controlled VCO of FIG. 8A.
Figure 8C:
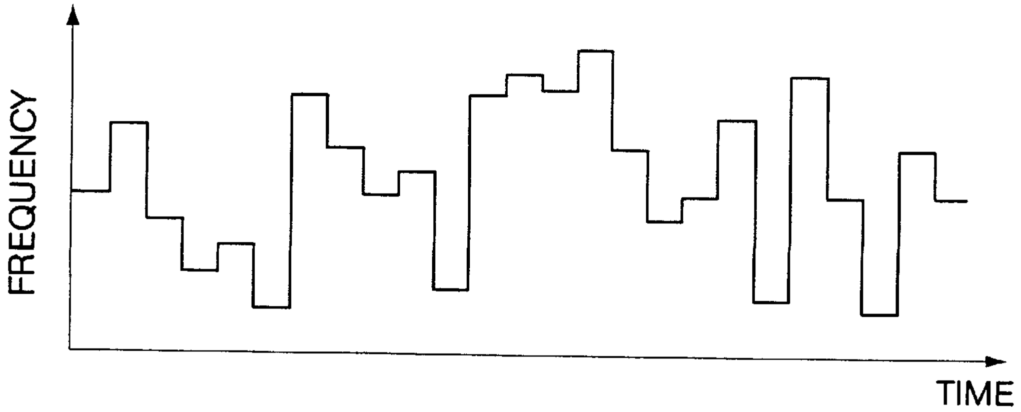
FIG. 8C shows an example of a random staircase that can be produced by the DAC controlled VCO of FIG. 8A; and, FIG. 9 shows a schematic of a modified PFC (power factor correction) circuit that adds amplitude control to the system according to the present invention.

An alternate way to control the frequency changes of this invention is shown in FIG. 8A. The method consists of specifying changing digital numbers into a DAC 90 (digital to analog converter) and then driving a VCO 91 with the output of the DAC. The VCO 91 produces the changing frequencies in response to the changing digital numbers. FIG. 8B shows a typical staircase sweeping frequency output that can result from this circuitry. If the time at each level 92 is less than the period of the frequency being produced, then the changing frequency will be a different frequency each cycle or each fraction of a cycle. If the time at each level 92 is more than the period of the frequency being produced, then there can be two or more cycles of one frequency before the frequency changes to the next frequency. FIG. 8C shows an example of a random staircase function that can be produced by the circuitry represented in FIG. 8A by inputting random digital numbers into the DAC 90. FIGS. 8A, 8B and 8C represent the frequency changes in a single range. It is clear to someone skilled in the art that larger frequency changes are possible with this circuitry and therefore the jumping from one range to another range can also be done. It is also clear to someone skilled in the art that a separate DAC can be used for each frequency range to increase the resolution of the frequency changes. A hybrid system is also possible, i.e., using the DAC and VCO of FIG. 8A for the changes within the frequency range and using the digital number input to the series string of resistors as shown in FIG. 3B (sheets 2 of 2 to select the specific frequency range.

It should be noted that the changing of frequency within a frequency range or amongst frequency ranges could be done with digital circuitry, analog circuitry or a hybrid combination of analog and digital circuitry. In the case of pure analog control, frequency changes within a range are normally high resolution, e.g., a different frequency every one half of a cycle, every one-quarter of a cycle or lesser fraction of a cycle. In the case of digital circuitry or hybrid analog digital circuitry, the resolution of changes depends on the speed at which the digital number is changed. This causes the staircase type of function when the resolution is low, e.g., several cycles of one frequency before several cycles of a different frequency are produced. In the purest sense, all changes can be considered a staircase function because, for example, the one half cycle changes can be considered stairs with a width equal to the time of the one half cycle.

FIG. 8B is drawn to show a constant sweep rate of the staircase function. A non constant sweep rate to eliminate resonances that can occur at a constant sweep rate or a monotonic sweep function to help remove contamination from the tank are other variations to the function shown in FIG. 8B. The non-constant sweep rate and the monotonic changing frequency are best combined to give both of the advantages. It is often most practical to simulate the monotonic function by sweeping in the high to low frequency direction for at least 90% of the time and to recover from the low frequency point to the high frequency point during the remaining time.

Figure 9:
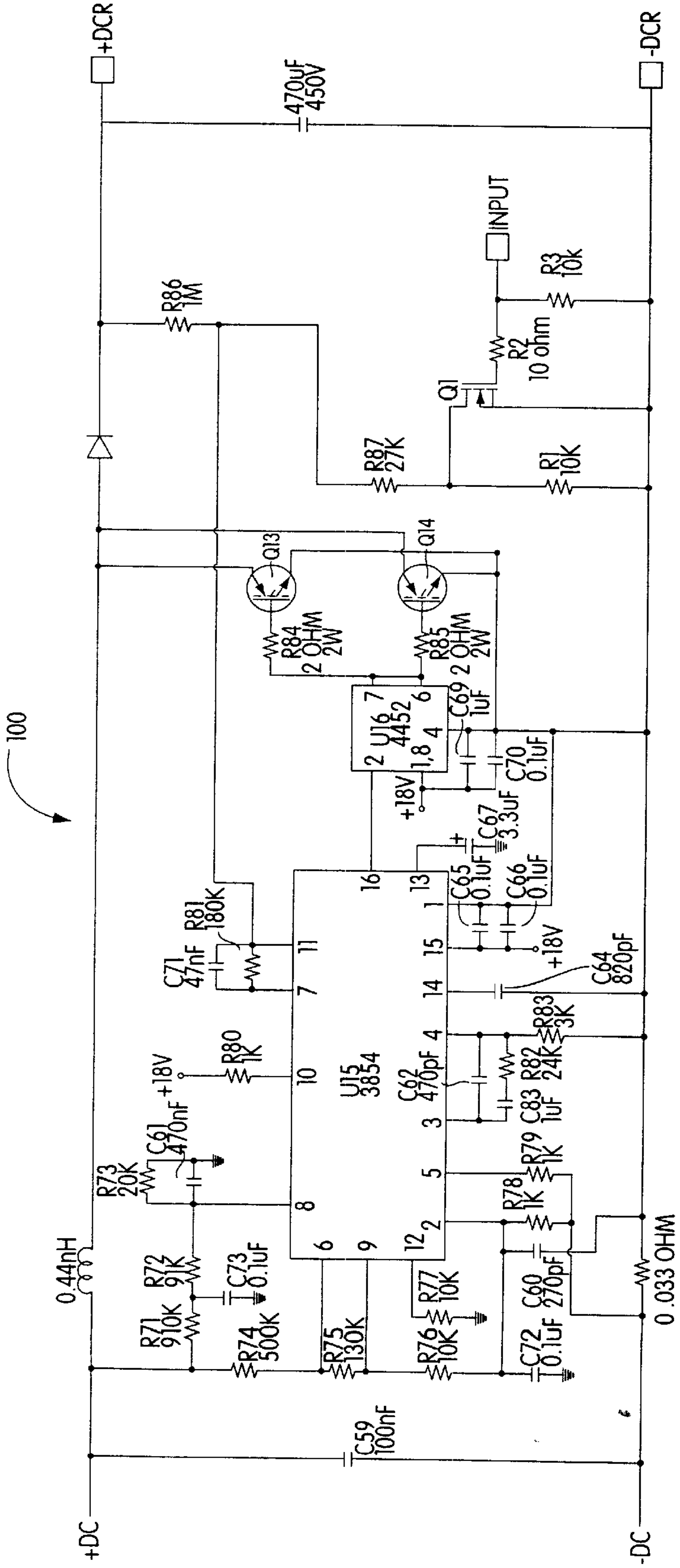

The above designs adjust the duty cycle of the generator output to regulate and/or control the output power of the system. It is sometimes advantageous to regulate and/or control the output power of the system by adjusting the amplitude of the generator's output voltage instead of the duty cycle. One way to accomplish this is by replacing the DC power supply in FIG. 3A consisting of bridge diode 33 and capacitor 34 with a modified PFC (power factor correction) circuit 100 as shown in FIG. 9. The operation of PFC circuits is well known to people skilled in the art, the modification to the PFC circuit 100 consists of the addition of R1, R2, R3 and Q1 to form an input that will allow the adjustment of the regulated output voltage of the PFC circuit 100. In operation, the control line P5 from the output power regulator 39 in FIG. 3A is connected to the input of PFC circuit 100 in FIG. 9. If more power is needed, the control line rises in voltage causing the PFC circuit 100 to regulate at a higher output voltage causing the generator 29 to increase its output power. The opposite occurs in the lower power direction. A stable condition occurs when the actual output power substantially equals the specified output power. It is clear to someone skilled in the art that both duty cycle and amplitude can be used to adjust the output power of the system. For example, the system could be set so the duty cycle stayed at maximum while the amplitude was used to do the adjusting of the output power, however, if the amplitude reached its lowest point, then the duty cycle would begin to decrease to maintain the control and/or regulation. Another configuration could use amplitude for regulation and duty cycle for control.

It is well known in the cleaning industry that each different frequency best removes a specific type and size of contamination. The inventor of this system has observed that the order in which the different frequencies are delivered to the liquid produces a new cleaning effect that best removes a specific type and size of contamination. For example, if the system produces three frequency ranges, say centered on 71.5 kHz, 104 kHz and 167.2 kHz, then there are six different orders or permutations of the frequency ranges that can be delivered to the liquid. They are (71.5,104, 167.2); (71.5, 167.2, 104); (104, 71.5, 167.2); (104, 167.2, 71.5);

(167.2, 71.5, 104) and (167.2, 104, 71.5). Since contamination typically occurs in many different types and sizes, the more new cleaning effects that the contamination is exposed to, the more contamination that will be removed. An additional advantage is obtained by changing the order in which the different permutations of frequency ranges are delivered to the liquid. If in the example, each permutation is considered a cleaning packet, then there are six cleaning packets. There are 720 different ways these cleaning packets can be ordered, each producing a useful cleaning effect that can be supplied in a practical manner with this inventive system.

The generator detailed in FIGS. 3A to 3F is a highly integrated system. It should be noted that the function of this generator can be simulated in many ways that are more primitive by those skilled in the art and these other implementations are considered within the scope of this invention.

The invention may be embodied in other specific forms without departing from the spirit or essential characteristics thereof. The present embodiments are therefore to be considered in respects as illustrative and not restrictive, the scope of the invention being indicated by the appended claims rather than by the foregoing description, and all changes which come within the meaning and range of the equivalency of the claims are thus intended to be embraced therein.

What is claimed is:

1. A system for coupling sound energy to a liquid, comprising:

at least two transducers forming a transducer array adapted for coupling to a liquid in a container, the transducer array constructed and arranged so as to be capable of producing intense sound energy in the liquid at any frequency within at least two non-overlapping frequency bands;

a signal generator adapted for producing a driver signal for driving the transducer array at any frequency from one or more continuous frequency ranges within each of the at least two frequency bands;

wherein the signal generator drives the transducer array to produce the intense sound energy characterized by a series string of different frequencies within one of the continuous frequency ranges, the generator further drives the transducer array to discontinuously jump amongst the frequency ranges, so as to generate intense sound energy characterized by a series string of different frequencies within at least one additional frequency range in at least one additional frequency band.

2. A system according to claim 1, further including controller for controlling (i) the frequency of the ultrasonic energy within the series string of different frequencies, and (ii) a duration of each frequency in the series string.

3. A system according to claim 1, wherein the intense sound energy in the series string of different frequencies is characterized by a staircase function.

4. A system according to claim 1, wherein the intense sound energy in the series string of different frequencies is characterized by a series of monotonically decreasing frequencies.

5. A system according to claim 4, wherein the series of monotonically decreasing frequencies occurs for at least ninety percent of an interval during which the transducer array couples intense sound energy to the liquid.

6. A system according to claim 1, wherein the intense sound energy in the series string of different frequencies is characterized by a series of frequencies defined by a predetermined function of time.

7. A system according to claim 1, wherein the intense sound energy in the series string of different frequencies is characterized by a series of frequencies swept from a first frequency to a second frequency at a constant sweep rate.

8. A system according to claim 1, wherein the series of frequencies is swept at a non-constant sweep rate.

9. A system according to claim 1, wherein the intense sound energy in the series string of different frequencies is characterized by a random series of frequencies.

10. A system according to claim 1, wherein the intense sound energy in the series string of different frequencies is characterized by at least a first group of frequencies from a first frequency band, and a second group of frequencies from as second frequency band, such that at least two groups of frequencies adjacent in time are from different frequency bands.

11. A system according to claim 10, wherein the series string of different frequencies further includes at least one degas interval between periods of time having ultrasonic energy.

12. A system according to claim 1, wherein the intense sound energy in the series string of different frequencies is characterized by at least a first group of frequencies from a first frequency band, and a second group of frequencies also from the first frequency band, such that at least two groups of frequencies adjacent in time are from the same frequency band.

13. A system according to claim 1, wherein the intense sound energy in each of the series string of different frequencies is characterized by at least a fraction of a cycle of the distinct frequency.

14. A system according to claim 13, wherein the fraction of a cycle is one-half of a cycle, and each successive one-half cycle represents a different frequency.

15. A system according to claim 1, wherein the intense sound energy includes frequencies selected from the frequency spectrum 9 kHz to 5 MHz.

16. A system according to claim 1, each of the frequency ranges being characterized by a center frequency, wherein the center frequency of each higher frequency range is a non-integer multiple of the center frequency of the lowest frequency range, so as to prevent one or more Fourier frequencies of a periodic wave from forming in the liquid.

17. A system according to claim 2, wherein the controller includes a PLC.

18. A system according to claim 2, wherein the controller includes a computer.

19. A system according to claim 2, including a probe adapted for measuring one or more parameters associated with the liquid corresponding to sound-produced effects in the liquid, wherein the controller alters the generator driver signal as (i) a predetermined function of the measured parameters, and (ii) according to a desired purpose of the system.

20. A system according to claim 2, wherein each specific frequency range is represented by a distinct digital code, and the controller initiates a transition from a first frequency range to a second frequency range in response to the digital code transitioning from a digital code representative of the first frequency range to the digital code representative of the second frequency range.

21. A system according to claim 16, wherein the center frequency of each frequency range corresponds to an output of a voltage controlled oscillator, the output of the voltage controlled oscillator corresponds to an input control signal, and the input control signal is determined by a series string of resistors.

22. A system according to claim 21, wherein the total string of resistors produces the lowest frequency range and each higher string of resistors produces each higher frequency range.

23. A system according to claim 1, wherein the intense sound energy includes ultrasonic energy.

24. A system according to claim 1, wherein the intense sound energy in the series string of different frequencies occurs continuously for at least 20 milliseconds, within each of the continuous frequency ranges.

25. A system according to claim 1, the driver signal being characterized by an output power level, wherein the output power level of the driver signal is actively maintained by comparing an actual output power level to a specified output power level, and adjusting parameters of the driver signal to make the actual output power level substantially equal to the specified output power level.

26. A system according to claim 25, wherein the parameters of the driver signal are selected from the group consisting of amplitude, duty cycle, and a combination thereof.

27. A system according to claim 1, wherein the intense sound energy characterized by the series string of different frequencies further includes one or more quiet time intervals characterized by a substantial absence of intense sound energy.

28. A system according to claim 27, wherein the quiet time intervals are distributed periodically among the intervals of intense sound energy.

29. A system according to claim 27, wherein the quiet time intervals are distributed randomly among the intervals of intense sound energy.

30. A system according to claim 27, wherein the quiet time intervals are distributed among the intervals of intense sound energy according to a predetermined function of time.

31. A system according to claim 16, wherein the center frequency for each frequency range is optimized by an automatic adjustment from a circuit that maintains a substantially zero phase shift between an associated output voltage and output current of the reference source at the center frequency.

32. A system according to claim 10, wherein the order of frequency range transitions varies such that several permutations of frequency ranges can be introduced into the liquid.

33. A system according to claim 32, wherein each permutation of frequency ranges is defined as a specific cleaning packet, and the order in which the cleaning packets are introduced into the liquid is changed such that each different order produces a different cleaning effect.

34. A system according to claim 1, wherein substantially no intense sound energy is produced at frequencies outside of the frequency ranges.

35. A system according to claim 1, wherein the container holding the liquid is constructed from materials resistant to detrimental effects of the liquids.

36. A system according to claim 35, wherein the materials are selected from the group consisting of tantalum, polyetheretherketone, titanium, polypropylene, Teflon, Teflon coated stainless steel, and combinations thereof.

37. A system according to claim 1, wherein the signal generator is capable of producing an infinite number of frequencies contained within each of the unconnected continuous frequency ranges.

38. A system according to claim 1, wherein the signal generator produces an output signal including FM information for synchronizing other generators or power modules.

39. A system according to claim 1, wherein the series string of different frequencies of each frequency range corresponds to an output of a voltage controlled oscillator, the output of the voltage controlled oscillator corresponds to an input control signal, and the input control signal is generated by a DAC.

40. A system according to claim 39, wherein a digital input to the DAC produces a stepped staircase analog output from the DAC, resulting in a stepped, staircase sweeping function within a frequency range.

41. A system according to claim 39, wherein a digital input to the DAC produces a random staircase analog output from the DAC, resulting in a random staircase sweeping function within a frequency range.

42. A system for coupling sound energy to a liquid, comprising:

at least two transducers forming a transducer array adapted for coupling to a liquid in a tank, the transducer array constructed and arranged so as to be capable of producing intense sound energy in the liquid at any frequency within at least two non-overlapping frequency bands;

a signal generator adapted for producing a driver signal for driving the transducer array at any frequency from one or more continuous frequency ranges within each of the at least two frequency bands;

wherein the signal generator drives the transducer array so as to produce intense sound energy characterized by a plurality of changing frequencies within a first frequency range, followed by a plurality of changing frequencies within a second frequency range, so as to reduce a strong antinode below a liquid-to-air interface.

43. A system according to claim 42, wherein the changing frequencies within each frequency range include a sweeping frequency.

44. A system according to claim 43, wherein the sweep rate of the sweeping frequency is non-constant.

45. A system according to claim 42, wherein the changing frequencies within each frequency range include a stepped, staircase frequency function.

46. A system according to claim 42, wherein the changing frequencies within each frequency range change monotonically from a high frequency to a low frequency for at least 90% of the time that the transducer array produces intense sound.

47. A system according to claims 42, further including a degas time inserted between a frequency change from a first frequency range to a second frequency range.

48. A system according to claim 42, wherein the intense sound energy includes frequencies from a frequency spectrum ranging from 9 kHz to 5 MHz.

49. A system according to claim 42, wherein the non-overlapping frequency bands are at least 1 kHz, and are separated by at least 5 kHz.

50. A system according to claim 49, wherein the continuous frequency ranges are 300 Hz or greater in size.

51. A system according to claim 49, wherein the continuous frequency ranges are equal in size to the frequency bands in which they are contained.

52. A system according to claim 42, each of the continuous frequency ranges being characterized by a center frequency, wherein the center frequencies of the higher frequency ranges are non integer multiples of the center frequency of the lowest frequency range to prevent one or more Fourier frequencies of a periodic wave from forming in the liquid.

53. A system according to claim 42, wherein the transducer array is constructed and arranged so as to exhibit strong resonances at a fundamental frequency of the transducers, and at one or more harmonic frequencies of the transducers.

54. A system according to claim 42, wherein the transducers are constructed and arranged so as to exhibit strong resonances at more than one harmonic frequency of the transducers.

55. A system according to claim 42, further including a controller for controlling the signal generator to select the frequency ranges.

56. A system according to claim 55, wherein the controller is selected from the group consisting of a PLC and a computer.

57. A system according to claim 55, including a probe adapted for measuring one or more parameters associated with the liquid corresponding to sound-produced effects in the liquid, wherein the controller alters the generator driver signal as (i) a predetermined function of the measured parameters, and (ii) according to a desired purpose of the system.

58. A system according to claim 55, wherein each frequency range is represented by a distinct digital code, and the controller initiates a transition from a first frequency range to a second frequency range in response to the digital code transitioning from a digital code representative of the first frequency range to the digital code representative of the second frequency range.

59. A system according to claim 52, wherein the center frequency of each frequency range corresponds to an output of a voltage controlled oscillator, the output of the voltage controlled oscillator corresponds to an input control signal, and the input control signal is determined by a series string of resistors.

60. A system according to claim 59, wherein the total string of resistors produces the lowest frequency range and each higher string of resistors produces each higher frequency range.

61. A system according to claim 42, wherein the intense sound energy includes ultrasonic energy.

62. A system according to claim 42, the driver signal being characterized by an output power level, wherein the output power level of the driver signal is actively maintained by comparing an actual output power level to a specified output power level, and adjusting parameters of the driver signal to make the actual output power level substantially equal to the specified output power level.

63. A system according to claim 62, wherein the parameters of the driver signal are selected from the group consisting of amplitude, duty cycle, and a combination thereof.

64. A system according to claim 42, wherein the sound energy from the signal generator further includes quiet time intervals characterized by a substantial absence of intense sound energy.

65. A system according to claim 64, wherein the quiet time intervals are distributed periodically among the intervals of intense sound energy.

66. A system according to claim 64, wherein the quiet time intervals are distributed randomly among the intervals of intense sound energy.

67. A system according to claim 64, wherein the quiet time intervals are distributed among the intervals of intense sound energy according to a predetermined function of time.

68. A system according to claim 52, wherein the center frequency for each frequency range is optimized by an automatic adjustment from a circuit that maintains a substantially zero phase shift between an associated output voltage and output current of the reference source at the center frequency.

69. A system according to claim 42, wherein the transducer array further produces intense sound characterized by one or more frequency ranges in addition to the first and second frequency ranges, and the order of frequency range transitions varies such that several permutations of frequency ranges can be introduced into the liquid.

70. A system according to claim 69, wherein each permutation of frequency ranges is defined as a specific cleaning packet, and the order in which the cleaning packets are introduced into the liquid is changed such that each different order produces a different cleaning effect.

71. A system according to claim 42, wherein substantially no intense sound energy is produced at frequencies outside of the frequency ranges.

72. A system according to claim 42, wherein the container holding the liquid is constructed from materials resistant to detrimental effects of the liquids.

73. A system according to claim 72, wherein the materials are selected from the group consisting of tantalum, polyetheretherketone, titanium, polypropylene, Teflon, Teflon coated stainless steel, and combinations thereof.

74. A system according to claim 42, wherein the changing frequencies within a frequency range are in increments of one-half of a cycle, and each successive one-half cycle is a different frequency.

75. A system for coupling sound energy to a liquid, comprising:

at least two transducers forming a transducer array adapted for coupling to a liquid in a tank, the transducer array constructed and arranged so as to be capable of producing intense sound energy in the liquid at any frequency within at least two distinct frequency bands;

a signal generator adapted for producing a driver signal for driving the transducer array at any frequency from one or more continuous frequency ranges within each of the at least two frequency bands, each of the continuous frequency ranges being characterized by a center frequency, wherein the center frequencies of the higher frequency ranges are non integer multiples of the center frequency of the lowest frequency range to prevent two or more Fourier frequencies of a periodic wave from forming in the liquid;

wherein the signal generator drives the transducer array to produce sound energy corresponding to a first set of frequencies from a first frequency range, then produces sound energy corresponding to a second set of frequencies from a second frequency range, such that the transition from the first frequency range to the second frequency range is discontinuous and occurs after a time interval at least as long as the lifetime of sound energy in the container for frequencies from the first frequency range, and the sound energy corresponding to the second set of frequencies continues for a time interval at least as long as the lifetime of sound energy in the container for frequencies from the second frequency range.

76. A system according to claim 75, wherein a degas time interval is inserted between the transition from the first frequency range to the second frequency range.

77. A system according to claim 75, wherein the sound energy consists of frequencies selected from a frequency spectrum 9 kHz to 5 MHz.

78. A system according to claim 75, wherein the distinct frequency bands are at least 1 kHz in size and are separated by at least 5 kHz.

79. A system according to claim 78, wherein the frequency ranges are 300 Hz or greater in size.

80. A system according to claim 75, wherein the set of frequencies of sound within a frequency range are in the form of a staircase function.

81. A system according to claim 79, wherein the frequency ranges are equal in size to the frequency bands in which they are contained.

82. A system according to claim 75, wherein the array of transducers exhibits strong resonances at the fundamental frequency of the transducers and at one or more of the harmonic frequencies of the transducers.

83. A system according to claim 75, wherein the transducers exhibit strong resonances at more than one harmonic frequency of the transducers.

84. A system according to claim 75, further including a controller for controlling the signal generator, wherein the controller is selected from the group consisting of a PLC and a computer.

85. A system according to claim 75, wherein a probe measures the sound produced effects in the liquid and alters a control input to the generator so as to modify the driver signal, such that the system improves the cleaning or processing effect.

86. A system according to claim 75, further including a controller for controlling the signal generator, wherein each frequency range is represented by a distinct digital code, and the controller initiates a transition from a first frequency range to a second frequency range in response to the digital code transitioning from a digital code representative of the first frequency range to the digital code representative of the second frequency range.

87. A system according to claim 75, wherein each frequency range is characterized by a center frequency, and the center frequency of each frequency range is determined by a voltage controlled oscillator, the frequency control of the VCO being determined by a series string of resistors where the total string of resistors produces the lowest frequency range and each higher string of resistors produces each higher frequency range.

88. A system according to claim 75, wherein the lifetime of sound in the tank is typically in the range of 20 milliseconds to 70 milliseconds.

89. A system according to claim 75, wherein the generator produces a series string of different frequencies within a frequency range, and the different frequencies are in increments of one-half of a cycle, such that each successive one-half cycle is characterized by a different frequency.

90. A system according to claim 75 wherein the tank holding the liquid is constructed from materials resistant to detrimental effects of the liquids.

91. A system according to claim 90, wherein the materials are selected from the group consisting of tantalum, polyetheretherketone, titanium, polypropylene, Teflon, Teflon coated stainless steel, and combinations thereof.

92. A system according to claim 75 the driver signal being characterized by an output power level, wherein the output power level of the driver signal is actively maintained by comparing an actual output power level to a specified output power level, and adjusting parameters of the driver signal to make the actual output power level substantially equal to the specified output power level.

93. A system according to claim 92, wherein the parameters of the driver signal are selected from the group consisting of amplitude, duty cycle, and a combination thereof.

94. A system according to claim 75, wherein the sound energy from the signal generator further includes quiet time intervals characterized by a substantial absence of intense sound energy.

95. A system according to claim 94, wherein the quiet time intervals are distributed periodically among the intervals of intense sound energy.

96. A system according to claim 94, wherein the quiet time intervals are distributed randomly among the intervals of intense sound energy.

97. A system according to claim 94, wherein the quiet time intervals are distributed among the intervals of intense sound energy according to a predetermined function of time.

98. A system according to claim 75, wherein the center frequency for each frequency range is optimized by automatic adjustment from circuitry that maintains substantially zero phase shift between the output voltage and output current at the center frequency.

99. A system according to claim 98, wherein the circuitry includes a phase lock loop.

100. A system according to claim 75, wherein the generator is capable of producing the infinite number of frequencies contained in each frequency range.

101. A system according to claim 75, wherein the order of the transitions among frequency ranges is capable of being varied during the process so several permutations of frequency ranges can be introduced into the liquid during a processing cycle.

102. A system according to claim 101, wherein each permutation of frequency ranges is defined as a specific cleaning packet, and the order in which these cleaning packets are introduced into the liquid is changed such that each different order produces a different cleaning effect.

* * * * *